(12) United States Patent
Fujiwara et al.

(10) Patent No.: US 7,569,902 B2
(45) Date of Patent: Aug. 4, 2009

(54) ENHANCED TOGGLE-MRAM MEMORY DEVICE

(75) Inventors: Hideo Fujiwara, Duncanville, AL (US); Sheng-Yuan Wang, Milpitas, CA (US)

(73) Assignee: Board of Trustees of the University of Alabama, Tuscaloosa, AL (US)

( * ) Notice: Subject to any disclaimer, the term of this patent is extended or adjusted under 35 U.S.C. 154(b) by 20 days.

(21) Appl. No.: 11/589,676

(22) Filed: Oct. 30, 2006

(65) Prior Publication Data

US 2007/0097742 A1 May 3, 2007

Related U.S. Application Data

(60) Provisional application No. 60/731,537, filed on Oct. 28, 2005.

(51) Int. Cl.
*G11C 11/02* (2006.01)
*H01L 29/82* (2006.01)

(52) U.S. Cl. ............... 257/421; 257/427; 257/E29.323; 365/158

(58) Field of Classification Search ......... 257/421–427; 365/171–173, 157, 158; 438/3; 360/324–326, 360/313
See application file for complete search history.

(56) References Cited

U.S. PATENT DOCUMENTS 6,545,906 B1 4/2003 Savtchenko et al.
6,633,498 B1 10/2003 Engel et al.
2003/0048676 A1* 3/2003 Daughton et al. ........... 365/200
2004/0001352 A1* 1/2004 Nahas et al. ................ 365/158
2004/0067389 A1* 4/2004 Hasegawa et al. ........... 428/692

FOREIGN PATENT DOCUMENTS

WO WO 2007053517 5/2007

OTHER PUBLICATIONS

R. O'Handley, "Modern Magnetic Materials, Principles and Applications" Wiley and Sons, New York, 2000, p. 192).*
R. O'Handley, "Modern Magnetic Materials, Principles and Applications" Wiley and Sons, New York, 2000, p. 192.*
B.M. Moskowitz, "Hitchhiker's Guide to Magnetism" presented at the Environmental Magnetism Workshop held Jun. 5-8, 1991 at the Institute for Rock Magnetism.*
Desikan, et al.; On-chip MRAM as a High-Bandwidth, Low-Latency Replacement for DRAM Physical Memories. Department of Computer Sciences Tech Report TR-02-47 The University of Texas at Austin Sep. 27, 2002; pp. 1-17.
Engel, B. N., et al., A 4-Mbit toggle MRAM Based on a Novel Bit and Switching Method. GE-05, 9th Joint MMM/INTERMAG Conference, 2004.

(Continued)

*Primary Examiner*—Thanh V Pham
*Assistant Examiner*—Jami M Valentine
(74) *Attorney, Agent, or Firm*—Ballard Spahr Andrews & Ingersoll, LLP

(57) ABSTRACT

A toggle-MRAM device is disclosed that uses an SAF composite and lowers the operating field substantially with a wide operating field margin and high thermal stability using specific magnetic parameters. Consequently, this device enhances the performance of MRAM's, especially in its large operating field margin and high thermal stability characteristics with a low current.

23 Claims, 21 Drawing Sheets

OTHER PUBLICATIONS

Inomata, K., et al., Size-independent spin switching field using synthetic antiferromagnets. Appl. Phys. Lett., vol. 82, No. 16, Apr. 2003, pp. 2667-2669.

Kano, H., et al., MRAM with CoFeB based Magnetic tunnel Junctions. Presented at the 28th Annual Meeting of Mageticas Society of Japan, 22pF-11 (2004). (no english translation).

Leal, J. L. and Kryder, M. H., Spin valves exchange biased by Co/Ru/Co synthetic antiferromagnets. J. Appl. Phys. vol. 83, No. 7, pp. 3720-3723 (1998).

Speriosu, V.S. Gurney, B.A. Wilhoit, D. R. and Brown, L. B. Proceedings of the Digest of the Intermag'96, paper AA-04.

Pietambaram, S.V., et al., Exchange Coupling control and Thermal Endurance of Synthetic Antiferromagnet (SAF) Structures for MRAM. GE-03, 9th Joint MMM/INTERMAG Conference, 2004.

S. Chikazumi, "Physics of Ferromagnetism" second edition, Oxford Science Publication, p. 289 (1997).

Souza, R. C., et al., Sythetic ferrimagnet free layer tunnel junction for magnetic random access memories. J. Appl. Phys., vol. 91, No. 10, pp. 7700-7702 (2002).

Tezuka, N., et al., Single domain observation for synthetic antiferromagnetically coupled bits with low aspect ratios. Appl. Phys. Lett., vol. 82, No. 4, pp. 604-606 (2003).

van den Berg, H. A. M., et al., GMR Sensor Scheme with Artificial Antiferromagnetic Subsystem. IEEE Transactions on Magnetics. vol. 32. No. 5. Sep. 1996, pp. 4624-4626.

Worledge, D. C., Magnetic phase diagram of two identical coupled nanomagnets. Appl. Phys. Lett., vol. 84, No. 15, pp. 2847-2849 (2004).

International Search Report and Written Opinion for International Application No. PCT/US06/042218, issued by the U.S. International Searching Authority, dated Jun. 11, 2008.

* cited by examiner

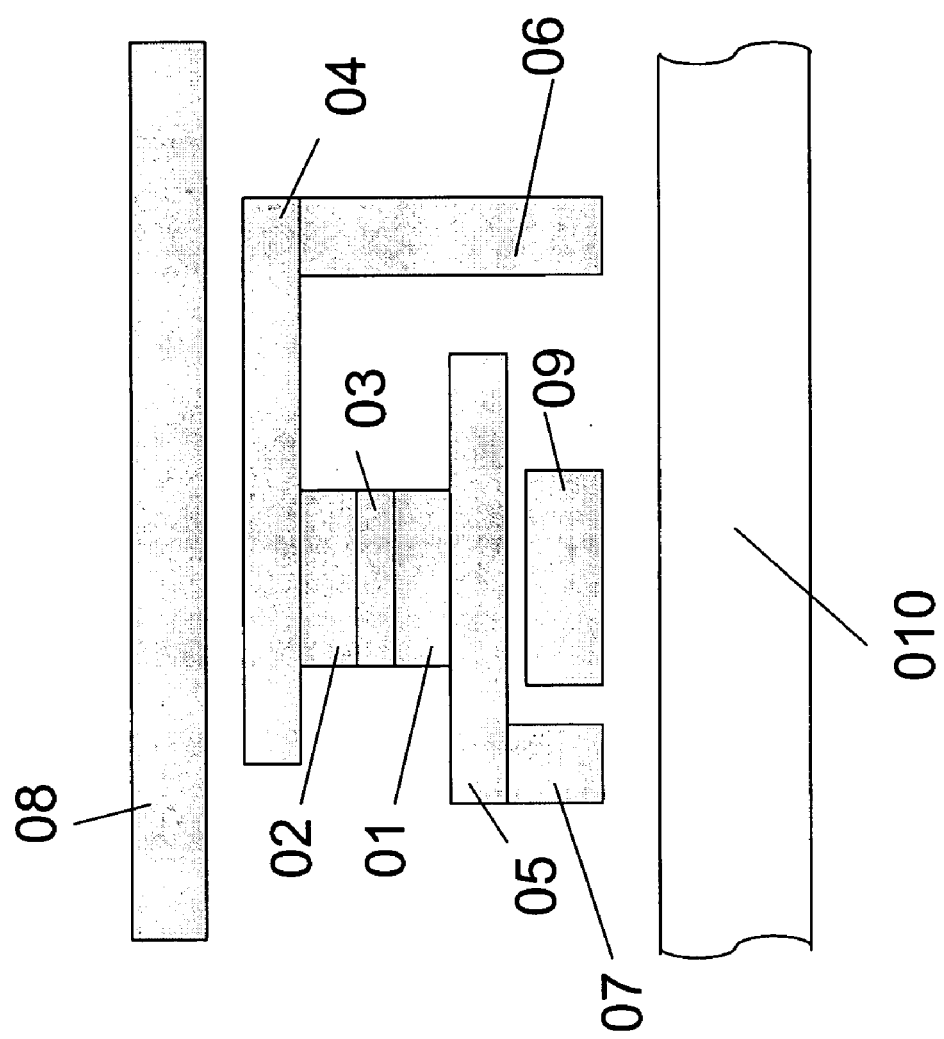

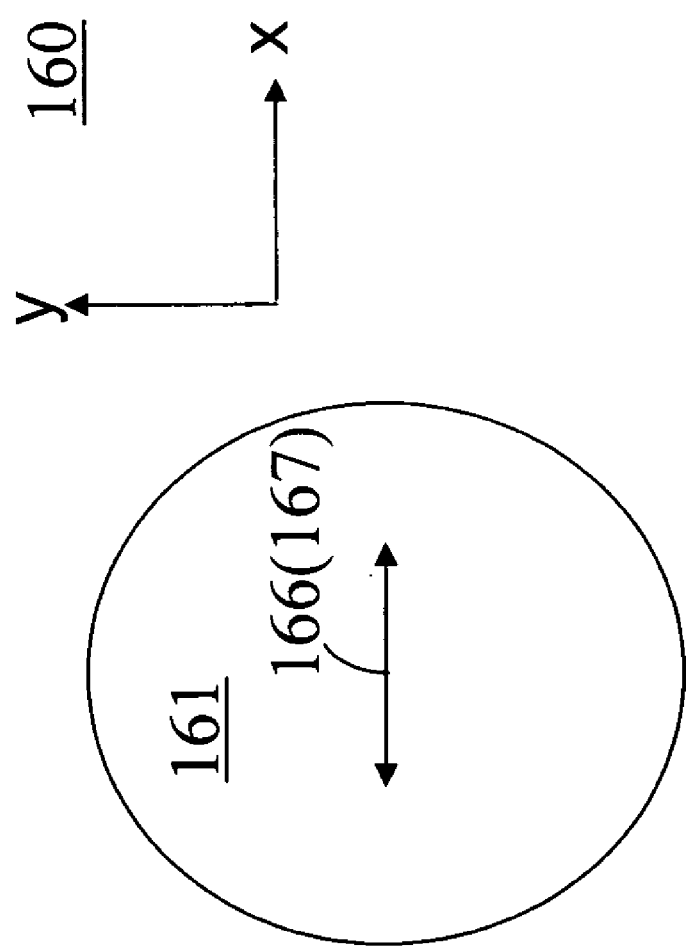

ENHANCED TOGGLE-MRAM MEMORY DEVICE

CROSS-REFERENCE TO RELATED PATENT APPLICATION

This application claims the benefit, pursuant to 35 U.S.C. §119(e), of the provisional U.S. Patent Application Ser. No. 60/731,537 filed Oct. 28, 2005, entitled "Enhanced Toggle-MRAM Memory Device," which application is hereby incorporated by reference in its entirety and made a part hereof.

This invention was made with Government support of Grant No. NSF MRSEC DMR 0213985, awarded by the National Science Foundation. The Government has certain rights in this invention.

BACKGROUND OF THE INVENTION

1. Field of the Invention

The present invention generally pertains memory devices, more particularly to MRAM, and even more particularly to toggle-MRAM memory devices.

2. Description of Related Art

With the continual evolution of technology and the popularity of computing devices, there is a quest for more effective memory devices. Magnetoresistance random access memory (MRAM) is a potential solution to this quest because of its unique features of nonvolatility and rewritability with potentially high output. With MRAM, however, there are challenges associated with increasing the scalability and decreasing the error rate which have limited its usability.

SUMMARY

In one aspect according to the present invention, a magnetic memory device is provided. The magnetic memory device of this aspect comprises one or more memory layer structures having an anti-parallel magnetization configuration. Each of the memory layer structures comprises a first ferromagnetic layer having a first uniaxial magnetic anisotropy comprised of a first induced uniaxial anisotropy or a first shape anisotropy. The first shape magnetic anisotropy has a first shape magnetic anisotropy easy axis and a first shape magnetic anisotropy hard axis and the first induced uniaxial magnetic anisotropy has a first induced uniaxial magnetic anisotropy easy axis and a first induced uniaxial magnetic anisotropy hard axis. The memory layer structures are further comprised of a second ferromagnetic layer having a second uniaxial magnetic anisotropy comprised of a second induced uniaxial anisotropy or a second shape anisotropy. The second shape magnetic anisotropy has a second shape magnetic anisotropy easy axis and a second shape magnetic anisotropy hard axis and the second induced uniaxial magnetic anisotropy has a second induced uniaxial magnetic anisotropy easy axis and a second induced uniaxial magnetic anisotropy hard axis. Further comprising the memory layer structure is an intermediate layer substantially between the first and second ferromagnetic layers. Between the first and second layers occurs magnetostatic coupling having a magnetostatic coupling strength with or without an exchange coupling. The magnetostatic coupling together with or without the exchange coupling causes the anti-parallel magnetization configuration of the memory layer structure to be stable without the application of an external magnetic field such that the magnetic memory device has a stable magnetization direction parallel to at least one of the first induced uniaxial magnetic anisotropy easy axis or of the first shape anisotropy. Each memory layer structure has a normalized total anisotropy field ($h_{k,total}$) and coupling field ($h_{couple}$) such that there is a relationship: $a(h_{couple}-1)+b(h_{couple}^2-1)^2 \leq h_{k,total} \leq 0.05(h_{couple}-1)$, with $h_{couple} > 1$.

In one aspect of a magnetic memory device according to the invention, for the relationship $a(h_{couple}-1)+b(h_{couple}^2-1)^2 \leq h_{k,total} \leq 0.05(h_{couple}-1)$, a and b are −0.81 and −0.002, respectively.

In another aspect of a magnetic memory device according to the invention, for the relationship $a(h_{couple}-1)+b(h_{couple}^2-1)^2 \leq h_{k,total} \leq 0.05(h_{couple}-1)$, a and b are −0.54 and −0.004, respectively.

In another aspect of a magnetic memory device according to the invention, for the relationship $a(h_{couple}-1)+b(h_{couple}^2-1)^2 \leq h_{k,total} \leq 0.05(h_{couple}-1)$, a and b are −0.26 and −0.004, respectively.

In another aspect of a magnetic memory device according to the present invention, the magnetic memory device has the first shape magnetic anisotropy easy axis and the second shape magnetic anisotropy easy axis aligned parallel to the first induced uniaxial magnetic anisotropy easy axis and the second induced uniaxial magnetic anisotropy easy axis.

In an other aspect of a magnetic memory device according to the present invention, the magnetic memory device has the first shape magnetic anisotropy easy axis and the second shape magnetic anisotropy easy axis aligned perpendicular to the first induced uniaxial magnetic anisotropy easy axis and the second induced uniaxial magnetic anisotropy easy axis, respectively.

In another aspect of a magnetic memory device according to the present invention, the magnetic memory device has a first ratio of an absolute value of the first shape magnetic anisotropy to the first induced uniaxial magnetic anisotropy that can be between approximately 0.8 and approximately 1.2 and a second ratio of an absolute value of the second shape magnetic anisotropy to the second induced uniaxial magnetic anisotropy that can be between approximately 0.8 and approximately 1.2.

In another aspect of a magnetic memory device according to the present invention, the magnetic memory device has a first ratio of an absolute value of the first shape magnetic anisotropy to the first induced uniaxial magnetic anisotropy that can be between approximately 0.9 and approximately 1.1 and a second ratio of an absolute value of the second shape magnetic anisotropy to the second induced uniaxial magnetic anisotropy that can be between approximately 0.9 and approximately 1.1.

In another aspect of a magnetic memory device according to the present invention, each magnetic layer of the magnetic memory device's memory layer structures has a total magnetic anisotropy defined as a summation of the shape magnetic anisotropy and the induced uniaxial magnetic anisotropy, and said total magnetic anisotropy is approximately equal to zero.

In another aspect of a magnetic memory device according to the invention, the magnetic memory device's first ferromagnetic layer's first induced uniaxial magnetic anisotropy is approximately $1 \times 10^5$ erg/cc or greater and the second ferromagnetic layer's second induced uniaxial magnetic anisotropy is approximately $1 \times 10^5$ erg/cc or greater.

In another aspect of a magnetic memory device according to the present invention, the magnetic memory device's first ferromagnetic layer and the second ferromagnetic are comprised of a magnetic material selected from the group consisting of Co, Fe, Ni and their alloys.

In another aspect of a magnetic memory device according to the present invention, the magnetic memory device's first ferromagnetic layer and the second ferromagnetic are comprised of a magnetic material selected from the group consisting of Co, Fe, Ni and their alloys deposited on top of a single or multiple seed layers of materials selected from the group consisting of Cr, Cu, Ta and Ti.

In another aspect of a magnetic memory device according to the present invention, the magnetic memory device's first ferromagnetic layer and the second ferromagnetic layer are deposited by means of oblique or glancing angle deposition.

In another aspect of a magnetic memory device according to the present invention, the magnetic memory device's first ferromagnetic layer and the second ferromagnetic layer are grown on top of a template formed by utilizing a copolymer coating. In another aspect of a magnetic memory device according to the present invention, the magnetic memory device's first ferromagnetic layer and the second ferromagnetic layer are comprised of body centered cubic materials, and is textured in the [011] direction.

In another aspect of a magnetic memory device according to the present invention, the magnetic memory device's first ferromagnetic layer and the second ferromagnetic layer are comprised of one or more of Fe or FeCo alloys.

In another aspect of a magnetic memory device according to the present invention, the magnetic memory device's intermediate layer substantially between said first and said second ferromagnetic layers is chosen from the group consisting of Ru, Rh, Ir, Fe, Ni, Co, Cu, Al, Ag, Pt, Mn, Ta, and Ti and their alloys.

In another aspect of a magnetic memory device according to the present invention, the magnetic memory device's memory layer structure further comprises magnetic exchange coupling having a magnetic exchange coupling strength between the first ferromagnetic layer and the second ferromagnetic layer and the magnetostatic coupling strength is greater than the exchange coupling strength.

In another aspect of a magnetic memory according to the present invention, the magnetic memory device's memory layer structure further comprises anti-parallel magnetic coupling having an anti-parallel magnetic coupling strength and the anti-parallel magnetic coupling strength is equal to or less than 0.1 erg/cm$^2$.

In another aspect of a magnetic memory device according to the present invention, the magnetic memory device operates in a toggle writing mode.

In another aspect of a magnetic memory device according to the present invention, the magnetic memory device's memory element further comprises an optimized normalized operating field ($h_{w,0}$) and said $h_{w,0}$ is controlled based at least in part by a relative bias field margin ($R_b$) applied to said memory element such that $h_{w,0}$ and $h_{couple}$ have the relationship expressed by $$h_{w,0} = \frac{h_{couple} - 1}{\alpha} + 0.5,$$

where $\alpha$ is defined as $2.28[1-\exp(-R_b/0.35)]$.

In another aspect of a magnetic memory device according to the present invention, the magnetic memory device's memory element further comprises an optimized normalized operating field ($h_{w,0}$) and said $h_{w,0}$ is controlled based at least in part based on the relationship $h_{w,0} \approx 0.37 + 0.43\, h_{couple}$.

In another aspect of a magnetic memory device according to the present invention, the first memory layer structure of the magnetic memory device has a total magnetic anisotropy defined as a summation of the first shape magnetic anisotropy and the first induced uniaxial magnetic anisotropy, and the second memory layer structure has the second shape magnetic anisotropy and the second induced uniaxial magnetic anisotropy, and the total magnetic anisotropy is approximately less than zero, word and digit fields can be applied at angle less than 45° with respect to the first and second shape magnetic anisotropy easy axes and first and second shape magnetic anisotropy easy axes of the memory layer structures.

Additional advantages of the invention will be set forth in part in the description which follows, and in part will be obvious from the description, or may be learned by practice of the invention. It is to be understood that both the foregoing general description and the following detailed description are exemplary and explanatory only and are not restrictive of the invention.

BRIEF DESCRIPTION OF DRAWINGS

The invention can be better understood with reference to the following figures where the components within the figures are not necessarily to scale, emphasis instead being placed upon clearly illustrating the principles of the invention; moreover, in the figures, like reference numerals designate corresponding parts or blocks throughout the different views:

FIG. 1a is a schematic cross-sectional view of a typical MRAM device having a structure used in an embodiment according to the present invention;

FIG. 16 is a plan view of the conceptual structure of the embodiment of the present invention whose cross-sectional view is shown in FIG. 15;

DETAILED DESCRIPTION

Figure 1B:
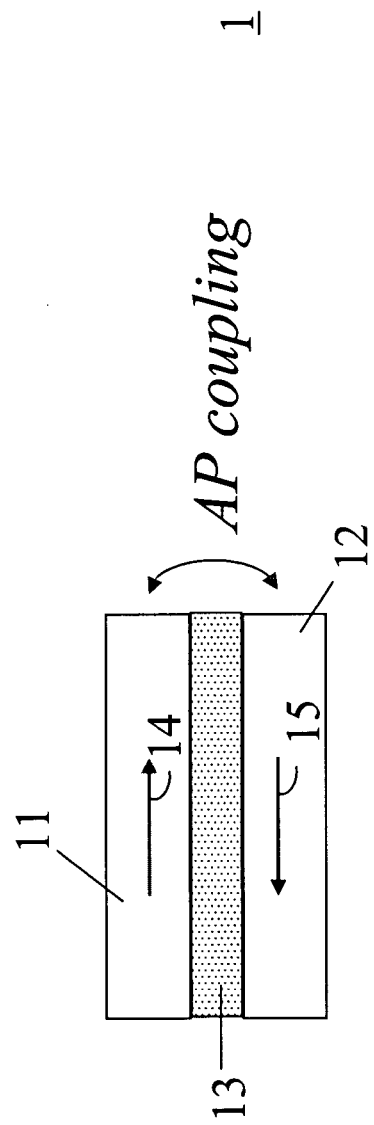
FIG. 1b is a cross-sectional view of a conceptual structure of a toggle-MRAM memory element of the related art.

The present invention may be understood more readily by reference to the following detailed description of the invention and the examples included therein and to the figures and their previous and following description.

Before the present systems, articles, devices, and/or methods are disclosed and described, it is to be understood that this invention is not limited to specific systems, specific devices, or to particular methodology, as such may, of course, vary. It is also to be understood that the terminology used herein is for the purpose of describing particular embodiments only and is not intended to be limiting.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

As used in the specification and the appended claims, the singular forms "a," "an" and "the" include plural referents unless the context clearly dictates otherwise. Thus, for example, reference to "a MRAM memory device" or a "magnetic memory element" includes two or more such devices, and the like.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that when a value is disclosed that "less than or equal to" the value, "greater than or equal to the value" and possible ranges between values are also disclosed, as appropriately understood by the skilled artisan. For example, if the value "10" is disclosed the "less than or equal to 10" as well as "greater than or equal to 10" is also disclosed. It is also understood that throughout the application, data is provided in a number of different formats and that this data represents endpoints and starting points, and ranges for any combination of the data points. For example, if a particular data point "10" and a particular data point 15 are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

"Optional" or "optionally" means that the subsequently described event or circumstance may or may not occur, and that the description includes instances where said event or circumstance occurs and instances where it does not.

Embodiments according to the present invention increase the operating magnetic field margin in order to make MRAM devices more usable. A synthetic antiferromagnet (SAF) composed of two ferromagnetic layers antiferromagnetically coupled through a non-magnetic layer, which increases the operating magnetic field margin, is used in one embodiment according to the present invention. Furthermore, in another embodiment, writing an SAF composite MRAM element when the word and digit fields are applied at about 45° with respect to the easy axis of the magnetic anisotropy of the element, each field being applied sequentially with some overlap also increases the operating magnetic field margin. This kind of writing, or 'toggle-mode switching,' also increases the thermal stability of the memory cells.

In short, one embodiment of a toggle-MRAM device according to the present invention uses an SAF composite and lowers the operating field substantially with a wide operating field margin and high thermal stability using specific magnetic parameters. Consequently, this device enhances the performance of MRAM's, especially in its large operating field margin and high thermal stability characteristics with a low current.

Generally, embodiments of the toggle-MRAM device according to the present invention can be incorporated into a memory device with a toggle writing mode using a memory layer structure. This structure can be composed of at least two ferromagnetic layers of essentially the same magnetic and structural parameters with an interlayer in between. Magnetostatic coupling between the two ferromagnetic layers, either with or without exchange coupling, causes the anti-parallel magnetization configuration to be stable when no external magnetic field is applied. The ferromagnetic layers can be elongated in one direction in the plane causing "shape anisotropy." In addition, the ferromagnetic layers can have an induced uniaxial anisotropy, called "intrinsic anisotropy," wherein an easy axis of the shape anisotropy and that of the intrinsic anisotropy are aligned either parallel or perpendicular to each other. The magnetostatic coupling strength, shape anisotropy and intrinsic anisotropy are adjusted so that the magnetoizations of the two layers are most stable when they make an anti-parallel configuration with one preferable direction in the film plane (called the stabilized direction when no external magnetic field is applied). Between the magnetic parameters called normalized total anisotropy field and magnetic coupling field denoted by $h_{k,total}$ and $h_{couple}$, respectively, there is a relationship as further indicated below:

$$a(h_{couple}-1)+b(h_{couple}^2-1)^2 \leq h_{k,total} \leq 0.05(h_{couple}-1),$$

with $h_{couple}>1$, where a and b are as indicated in Table 1.

TABLE 1

| Coefficients | 50% | 75% | 90% |
|---|---|---|---|
| a | −0.81 | −0.54 | −0.26 |
| b | −0.002 | −0.004 | −0.004 |

With the embodiment according to above-described device, an operating field can be controlled using the bias voltage. More specifically, the operating field is controlled, depending on the bias field to be applied, in such a way as $h_{w,0}$ and $h_{couple}$ as described herein hold the relationship expressed by the following equation:

$$h_{w,0} = \frac{h_{couple}-1}{\alpha} + 0.5,$$

with α as defined herein.

Turning now to the figures, FIG. 1a depicts the conceptual cross-sectional view of an exemplary embodiment of an MRAM device. In the embodiment shown in FIG. 1a, reference numeral 01 depicts a free layer, and the reference numeral 02 depicts a pinned layer structure. It is to be appreciated, however, that in other embodiments, and fully contemplated within the scope of this invention, that the free layer structure and the pinned layer structure may be exchanged. The reference numeral 03 identifies an insulator layer, which forms a magnetic tunnel junction (MTJ). The reference numerals 04 and 05 are upper and lower electrodes, and 06 and 07 are the leads connecting the MTJ to the switching transistors (not shown) set on the Si-wafer 010. The reference numeral 08 and 09 identify a word line and a digit line which provide the write fields to the MTJ. In other embodiments and contemplated within the scope of this invention, the word line 08 and the lower electrode 05 may be merged into a single component of a memory device.

Figure 2:
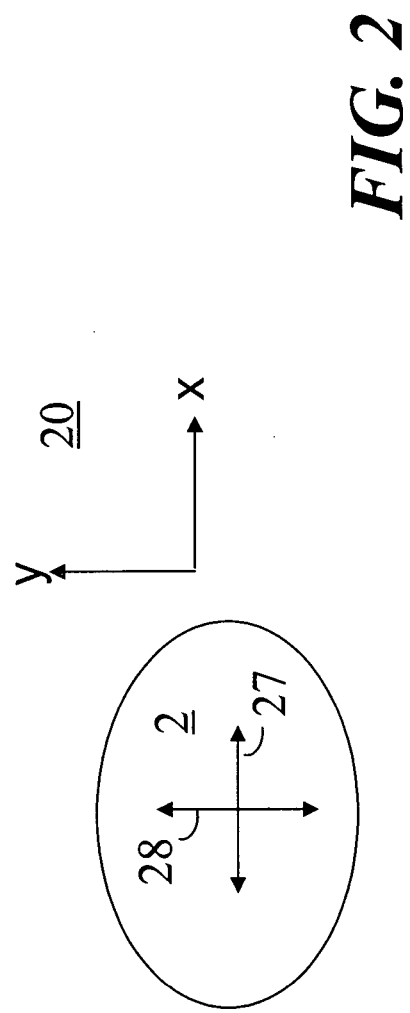
FIG. 2 is a plan view of a conceptual structure of a toggle-MRAM memory element of the related art.
Figure 4:
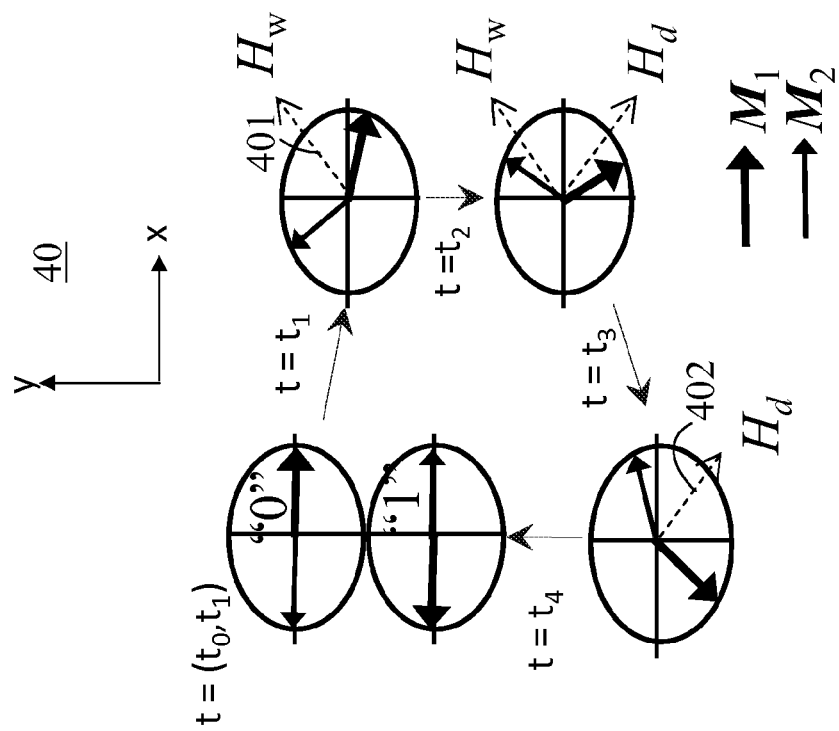
FIG. 4 is a schematic showing the magnetization configuration change corresponding to the sequence shown in FIG. 3.
Figure 3:
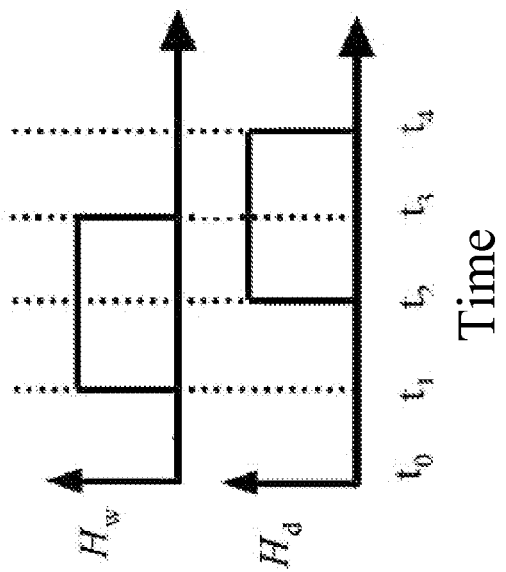
FIG. 3 is a diagram of the operating field application sequence.

FIG. 1b and FIG. 2 depict the cross-sectional view 1 and plan view 2 of a conceptual structure of an exemplary toggle-MRAM memory element. The memory-element 1 (2) is composed of a first magnetic layer structure 11 and a second magnetic layer structure 12 with an interlayer structure 13 disposed in between the first and second magnetic layer structures. The magnetic layers 11 and 12 possess uniaxial anisotropy whose easy axis 27 is in the long axis direction (x-direction), and hard axis 28 in the short axis direction (y-direction). Anti-parallel coupling effect exists through the magnetostatic coupling and/or exchange coupling between the two layer structures 11 and 12 so that the magnetizations $M_1$ 14 and $M_2$ 15 are aligned anti-parallel with each other when no magnetic field is applied. The element is incorporated into a memory device (not shown) equipped with a device to apply a magnetic field in the direction about +45° and about −45° with respect to the easy axis (e.a.), which are called "word field" denoted by $H_w$ and "digit field" denoted by $H_d$, respectively. FIG. 3 depicts schematically, the time sequence of the application of $H_w$ and $H_d$ to write "1" onto the state "0." FIG. 4 shows how the magnetization configuration changes with the sequential application of $H_w$ 401 and $H_d$ 402. If the same procedure is performed onto the "1" state thus obtained, "0" state results in the similar way as the above. This kind of write-mode is called 'toggle-mode' writing.

As is explained above, the easy axis of the total anisotropy, including both "shape-anisotropy" and "intrinsic-anisotropy" representing the uniaxial anisotropy originating from other causes than the shape effect, of the magnetic layer part has been aligned parallel to the long axis of the magnetic element. Hereinafter, the uniaxial anisotropy whose easy axis is parallel to the stable direction, say x-direction, of the magnetization axes of the anti-parallel configuration which is stable in the absence of applied field is called "positive," while the uniaxial anisotropy whose easy axis is perpendicular (y-direction) to the stable direction of the magnetization axes of the anti-parallel configuration which is stable in the absence of applied field is called "negative." Therefore, the total anisotropy of the memory element in FIG. 1b has been "positive" in the above sense.

In order to keep the memory for the desired time duration, the anisotropy of the memory element should be greater than some critical value, which will be called "memory retention anisotropy" denoted by K*. Then, the energy barrier ΔE of the anti-parallel coupled magnetic bi-layer systems which prevent the loss of memory by thermal agitation can be expressed as:

$$\Delta E \approx 2K^*V \quad (1)$$

with V denoting the volume of each magnetic layer part. Here, K* can be expressed as $$K^* = K_u + (1-r)K_{sh} = K_{total} - rK_{sh}, \quad (2)$$

where $$K_{total} = K_u + K_{sh}. \quad (3)$$

In the equations above, $K_{sh}$, $K_u$ and $K_{total}$ denote the shape anisotropy constant, intrinsic uniaxial anisotropy constant and the total anisotropy constant given by (3), and r denotes the attenuation factor defined as:

$$r = \frac{H_{m-s}}{H_{demag}}, \quad (4)$$

where $H_{m-s}$ is the average magnetostatic field originating from one of the magnetic layer part to the neighboring magnetic layer part composing the memory element over the latter layer, called effective magnetostatic coupling field, and $H_{demag}$ is the self-demagnetizing field in the former magnetic layer part. The critical field for magnetization flopping along the x-direction, and the magnetization saturation field in the x- and y-direction can be expressed as:

$$H_{flop} = \sqrt{H_k^*(H_{couple} + H_{k,total})}, \quad \text{for } H_{k,total} > 0 \qquad (5a)$$

$$H_{flop} = \frac{\sqrt{H_k^*}(H_{couple} - H_{k,total})}{\sqrt{H_{couple} + h_{k,total}}}, \quad \text{for } H_{k,total} < 0 \qquad (5b)$$

$$H_{x,s} = H_{couple} - H_{k,total}, \qquad (6a)$$

$$H_{y,s} = H_{couple} + H_{k,total}, \qquad (6b)$$

respectively. Here $H_{couple}$ is a coupling field parameter and $H_{k,total}$ is the anisotropy field corresponding to $K_{total}$. These parameters are given by:

$$H_{couple} = \frac{2J}{M_s t} + rM_s(N_x + N_y), \qquad (7)$$

$$H_{k,total} = \frac{2K_{total}}{M_s}, \qquad (8)$$

where J is the exchange coupling constant between the two magnetic layer parts, $M_s$ is the saturation magnetization of the magnetic material in each magnetic layer part, t is the thickness of each magnetic layer part, and $N_x$ and $N_y$ are the demagnetization factors in each layer part in the x-direction and y-direction, respectively. It is to be noted that, given $H_{x,s}$ and $H_{y,s}$, $H_{couple}$ and $H_{k,total}$ can be estimated by using the following equations:

$$H_{couple} = \frac{H_{x,s} + H_{y,s}}{2}, \qquad (7a)$$

$$H_{k,total} = \frac{H_{x,s} + H_{y,s}}{2}. \qquad (8a)$$

Figure 5:
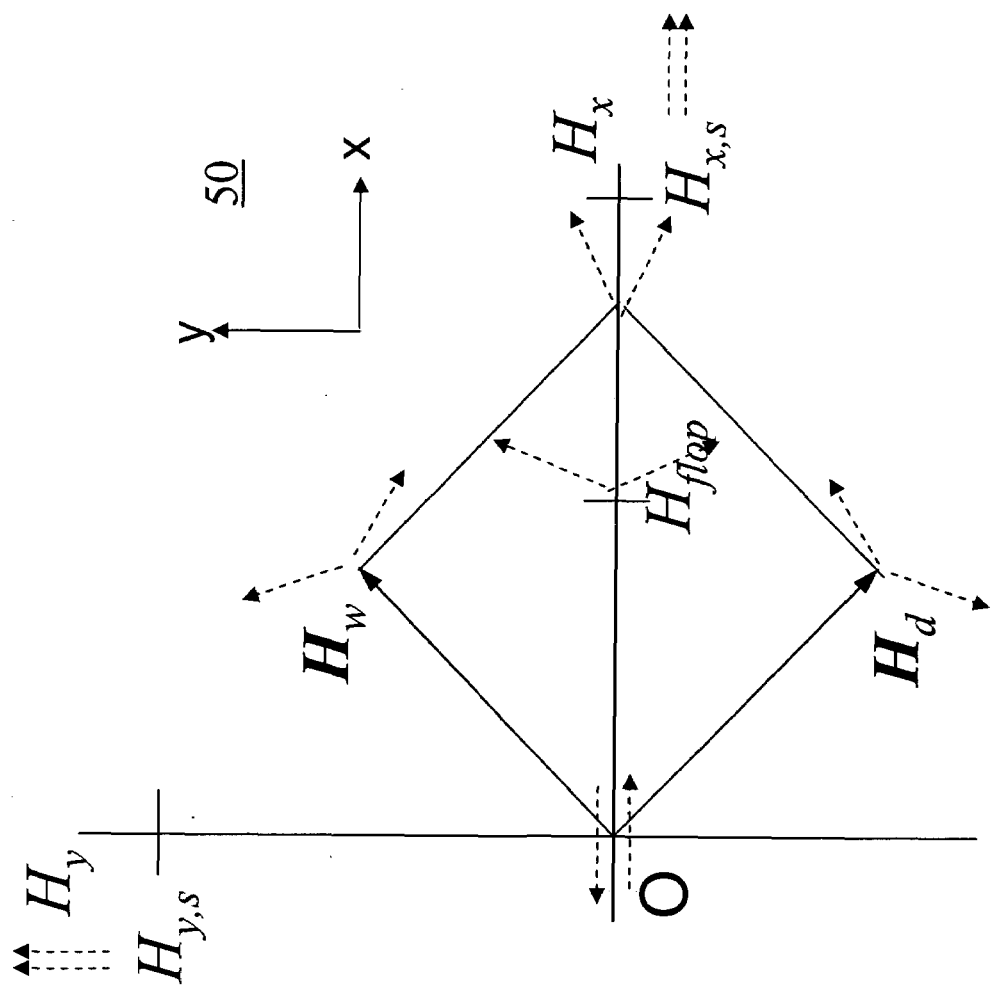
FIG. 5 is a schematic diagram of the operating fields applied to the memory element of the related art.

The summation of $H_w$ and $H_d$ should fall between the critical field for magnetization flopping field $H_{flop}$ and the saturation field $H_{x,s}$ both along the x-direction as shown in FIG. 5. In the figure, rough sketch of the spin configurations at several points in the $H_x$-$H_y$ diagram are shown by pairs of broken arrows. The summation of $H_w$ and $H_d$ should fall between the critical field for magnetization flopping field $H_{flop}$ and the saturation field $H_{x,s}$ both along the x-direction as shown in FIG. 5. Normalizing $H_{flop}$, $H_{x,s}$, $H_{y,s}$ and $H_{couple}$ by the effective anisotropy field $H_k^*$, which is defined by $$H_k^* = \frac{2K^*}{M_s}, \qquad (9)$$

and denoting each by $h_{flop}$, $h_{x,s}$, $h_{y,s}$ and $h_{couple}$, the following results:

$$h_{flop} = \sqrt{h_{couple} + h_{k,total}} \quad \text{for } h_{k,total} > 0, \qquad (10a)$$

$$h_{flop} = \frac{h_{couple} - h_{k,total}}{\sqrt{h_{couple} + h_{k,total}}} \quad \text{for } h_{k,total} < 0, \qquad (10b)$$

Figure 6:
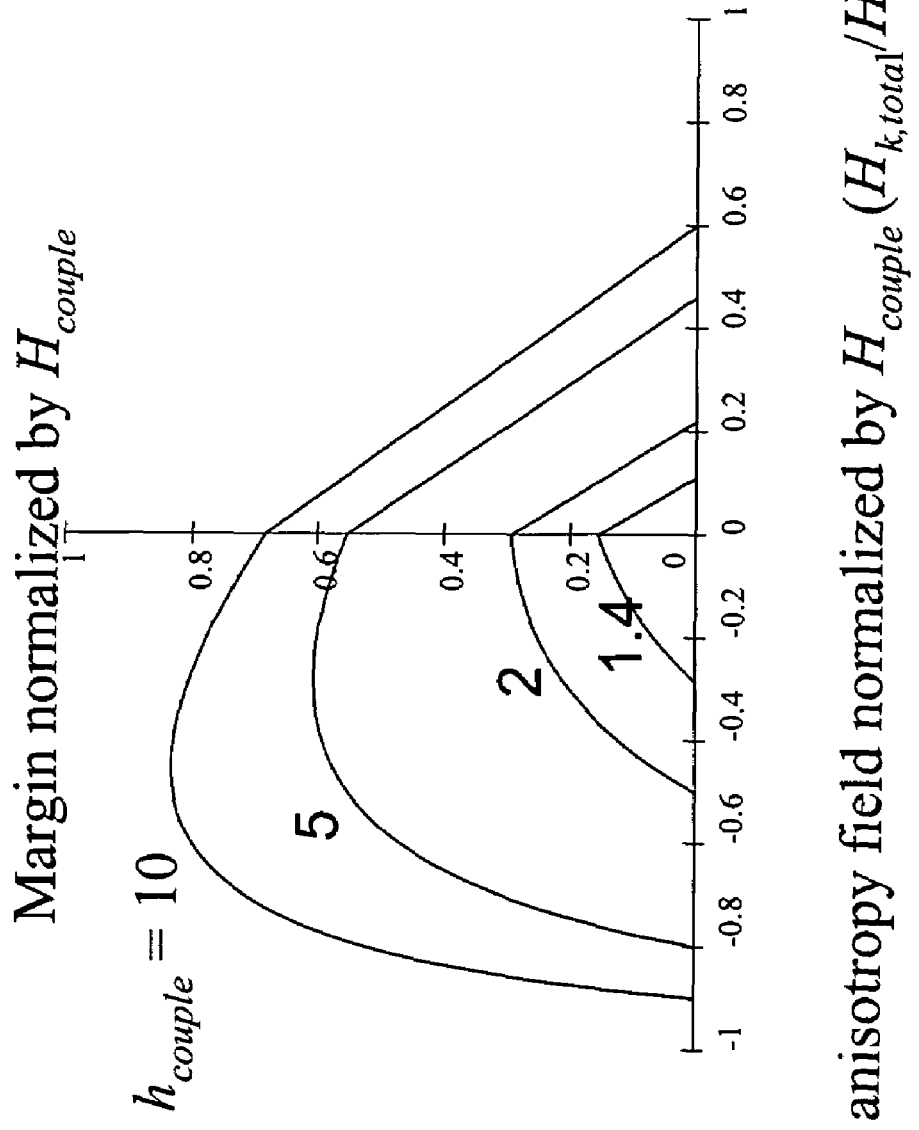
FIG. 6 is a graph showing the results obtained by analysis of the normalized operating field margin indices as functions of the normalized coupling field.

-continued $$h_{x,s} = h_{couple} - h_{k,total}, \qquad (11a)$$

$$h_{y,s} = h_{couple} + h_{k,total}. \qquad (11b)$$

with $h_{k,total}$ denoting $H_{k,total}$ normalized also by $H_k^*$. As was stated above, the tip of the vector field $H_w + H_d$ should fall between $H_{flop}$ and $H_{x,s}$ along the x-axis, and $H_w$ and $H_d$ are applied in +45° and −45° with respect to the x-axis, with $|H_w| = |H_d|$. Therefore, $\sqrt{2}H_w(\sqrt{2}h_w)$ should fall between $H_{flop}$ and $H_{x,s}$ ($h_{flop}$ and $h_{x,s}$), with $h_w$ denoting $H_w(=|H_w|)$ normalized by $H_k^*$. FIG. 5 shows a schematic illustration of the relationship between $H_w$ and $H_d$ with respect to the $H_{flop}$ and $H_{x,s}$ along the x-direction. Thus, the operating field margin is the span between $H_{flop}$ and $H_{x,s}$, where $H_{x,s} > H_{flop}$. Therefore, the minimal operating field is available for $H_{k,total} = 0$ ($h_{k,total} = 0$), which is equal to $\sqrt{H_k^* H_{couple}}/2(\sqrt{h_{couple}}/2)$. FIG. 6 shows the dependence of the margin on the total anisotropy field $H_{k,total}$ with $H_{couple}$ as a parameter, both being normalized by $H_{couple}$. It can be shown that the margin appears for a span of $h_{k,total}$ as shown below:

$$1 - h_{couple} < h_{k,total} < h_{couple} + \frac{1}{2} - \sqrt{2h_{couple} + \frac{1}{4}} \quad \text{for } h_{couple} > 1. \qquad (12)$$

Therefore, $h_{k,total}$ is set within the span shown in Eq. (12). In addition, the operating field margin is greater for negative $H_{k,total}$ than for positive $H_{k,total}$ for the same absolute value of $H_{k,total}$. For practical applications, however, the relative margin with respect to the magnitude of operating field $H_w$ ($H_d$) is an important index. The maximum relative margin can be attained when the tip of $H_w + H_d$ falls at the center of the span between $H_{flop}$ and $H_{x,s}$ along the x-axis. Therefore, $R_{margin}^{max}$ defined by the following expression makes a good index for the evaluation of the margin:

$$R_{margin}^{max} = \frac{H_{x,s} - H_{flop}}{H_{x,s} + H_{flop}}. \qquad (13)$$

Figure 7A:
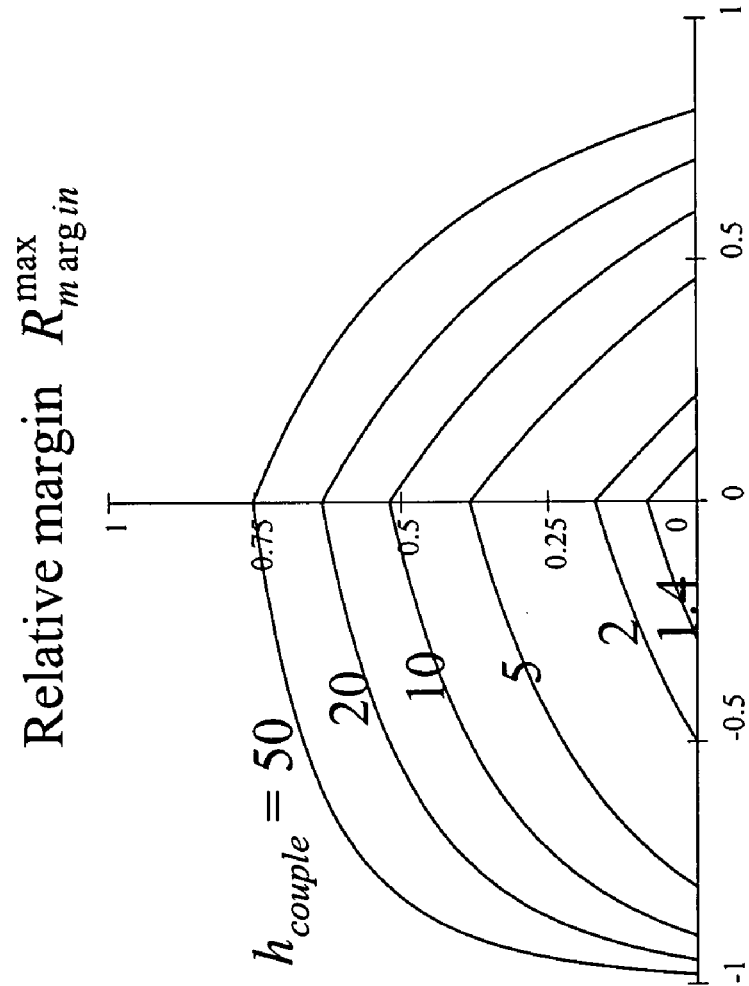
FIG. 7a is a graph showing normalized maximum relative operating field margins as functions of the total anisotropy field normalized by the coupling field.
Figure 7B:
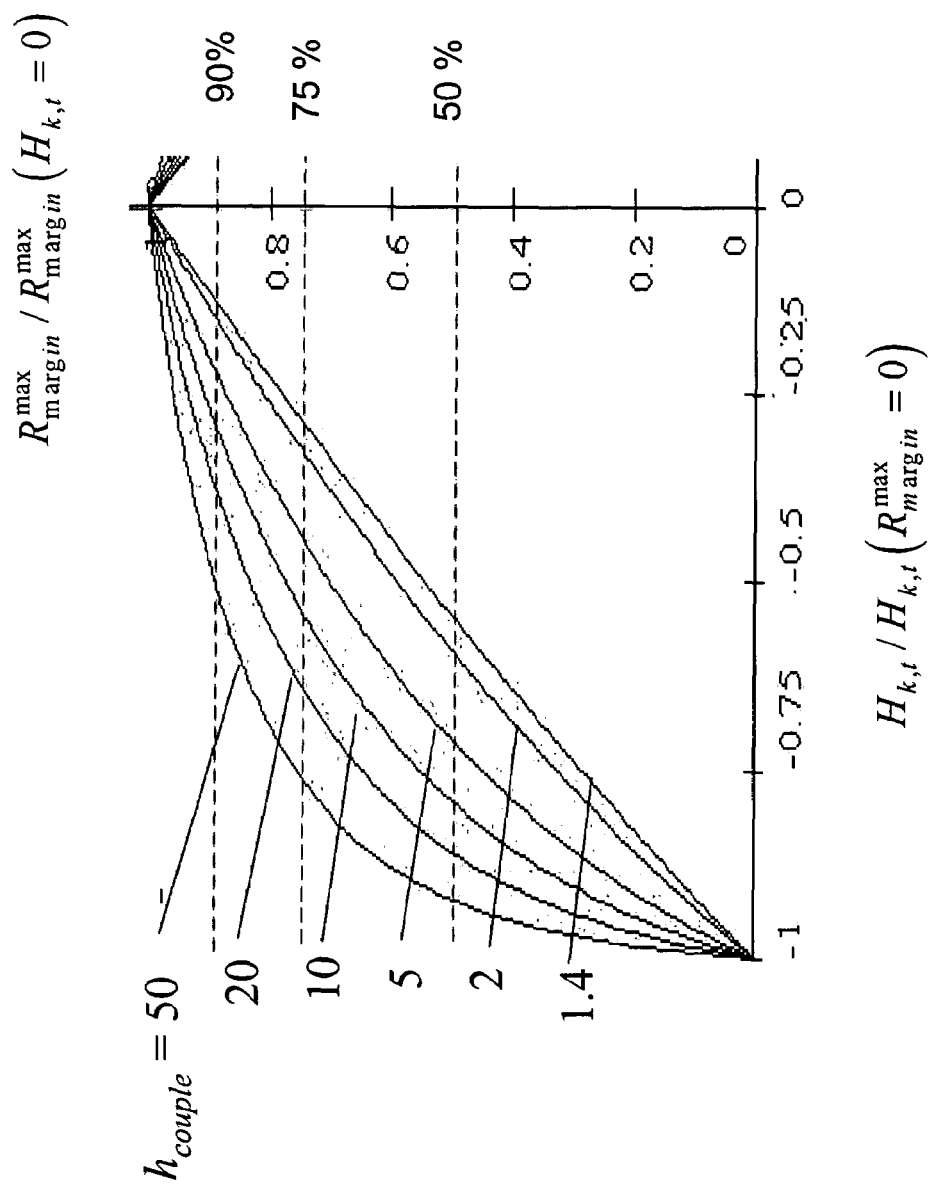
FIG. 7b is a graph showing the normalized curves corresponding to the curves in FIG. 7a at the peak values and the normalized positive and negative total anisotropy field values which give zero margin.
Figure 7C:
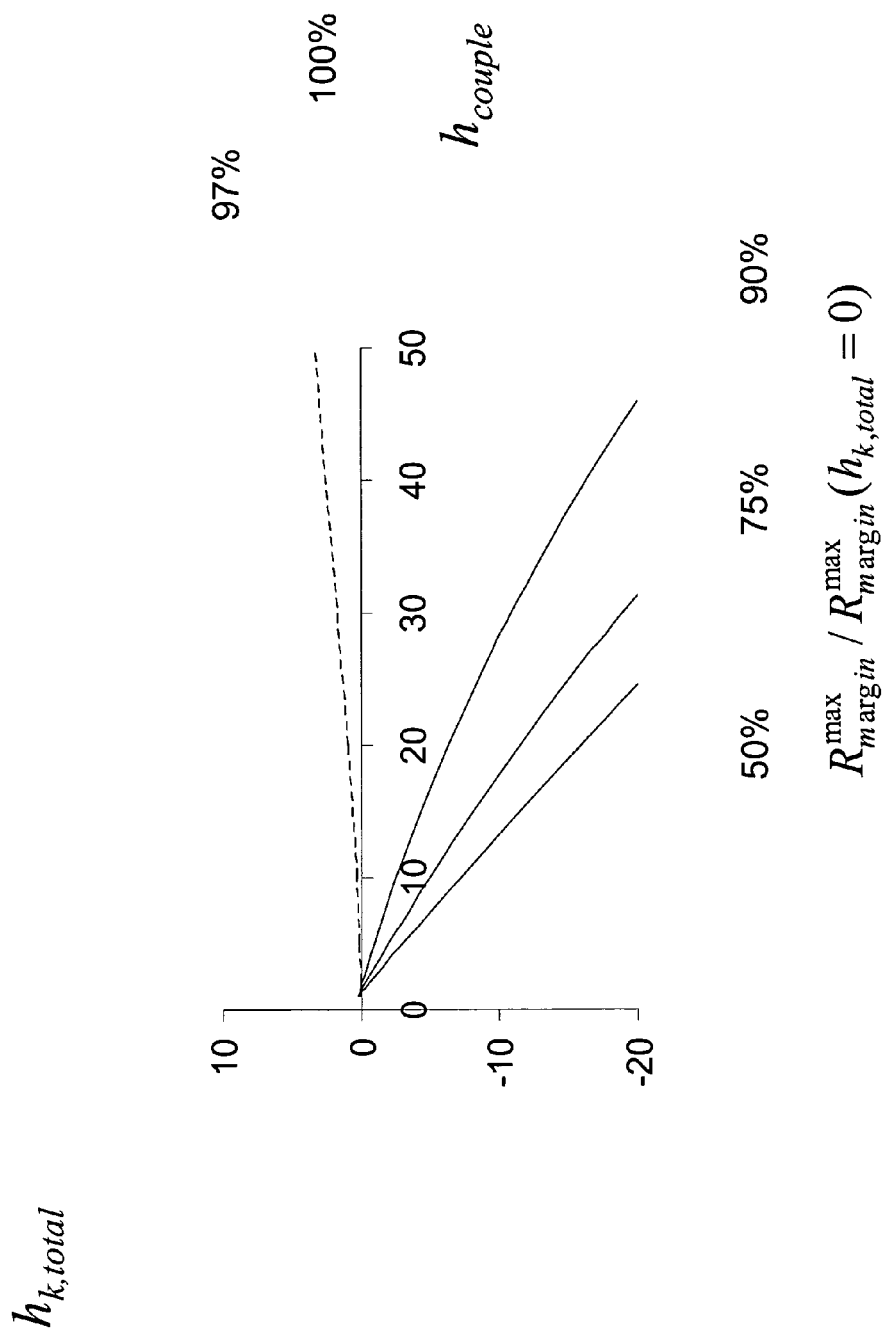
FIG. 7c is a graph showing the $h_{k,total}$ at the cross-points of the 50, 75, and 90% level for the negative $h_{k,total}$ and those of the 97% level for the positive $h_{k,total}$ with respect to the peak of FIG. 7a as functions of $h_{couple}$.

FIG. 7a shows the dependence of the relative margin $R_{margin}^{max}$ on the total anisotropy field $h_{k,total}$ with $h_{couple}$ as a parameter, both $R_{margin}^{max}$ and $h_{k,total}$ being normalized by $h_{couple}$, obtained by using Eqs. (10a), (10b), (11) and (13). It is seen that the maximum relative margin is obtained by setting the total anisotropy equal to zero ($h_{k,total} = 0$). It is also seen that the maximum relative margin is also greater for negative $H_{k,total}$ for the same absolute value of $H_{k,total}$. FIG. 7b shows normalized curves corresponding to the curves in FIG. 7a at the peak values and negative $h_{k,total}$ values which gives zero margin. The dashed lines labeled by 50%, 75%, and 90% indicate that the levels of attainable $R_{margin}^{max}$ with respect to its peak value attained at $H_{k,total} = 0$. Therefore, the cross-points with the curves give the range of $H_{k,total}$ for each $h_{couple}$ in which $R_{margin}^{max}$ can be made higher than those levels with respect to its peak value. FIG. 7c shows the $h_{k,total}$ v.s. $h_{couple}$ curves thus obtained. Those curves were found to be well fitted by a set of polynomials given by $$h_{k,total} = a(h_{couple} - 1) + b(h_{couple} - 1)^2 \text{ for } h_{couple} < 0 \qquad (13a)$$

where a and b are given as shown in Table 1. As for positive $h_{k,total}$, the decrease of the margin is so rapid with increasing $h_{couple}$ that it is better to make it as small as possible. However, some small values is allowable which can be increased with the increase of $h_{couple}$. Analysis showed that the broken line shown in FIG. 7c is a good approximation for the critical curve for the positive $h_{k,total}$ below which more than 97% of $R_{margin}^{max}$ for $h_{k,total}=0$ is attainable, which was further confirmed to be approximated by.

$$h_{k,total}=0.05(h_{couple}-1), \quad (13b)$$

within a relatively wide range of $h_{couple}$.

As was seen in FIG. 7a, $R_{margin}^{max}$ is maximum at $h_{k,total}=0$, and it is deduced that $h_{couple}$ should be greater than unity in order to obtain some operating field margin:

$$h_{couple}>1. \quad (14)$$

In order to retain the memory of the memory elements for reasonable time duration, each memory element should be endowed with a thermal relaxation time $\tau$, which is greater than a critical value $\tau_c$ to be determined as required, leading to the requirement, using Arrhenius-Néel formula, Eq. (1), and Eq. (9), $$K^* \geq \frac{k_B T \ln(f_0 \tau_c)}{2V} = K_0^*, \quad (15)$$

or $$H_k^* \geq \frac{k_B T \ln(f_0 \tau_c)}{M_s V} = H_{k0}^*, \quad (15')$$

where $k_B$ is Boltzman's constant, T is absolute temperature and $f_0$ is a frequency factor of the order of $10^9 \sim 10^{10}$. For typical volumes of $V=10^{-17} \sim 10^{-15}$ cm$^3$ and $M_s=800 \sim 1600$ emu/cm$^3$, T=300~400 K, and $\tau_c=10^{20} \sim 10^{23}$, $H_{k0}^*$ ranges from a few Oe to a few hundred Oe. The Arrhenius-Néel formula is described in greater detail in *Physics of Ferromagnetism* second edition by S. Chikazumi. Oxford Science Publication, p. 289 (1997). This section is hereby incorporated by reference.

When the easy axis of the total anisotropy of the magnetic layer part is aligned parallel to the long axis of the magnetic element, that is, $K_u > 0, K_{sh} > 0,$ leading to $$\frac{K_{total}}{K^*} = \frac{K^* + rK_{sh}}{K^*} = 1 + \frac{rK_{sh}}{K^*} > 1.$$

Thus, $h_{k,total} > 1.$

However, as is seen from FIG. 7a, the smaller $h_{k,total}$ is, the greater margin is available. As a matter of fact by making $K_{sh}$ negative, (i.e., by making the long axis of the element set orthogonal to the easy axis of the intrinsic anisotropy), it is possible to make $h_{k,total}<1$. Even still, there should be an indication of the optimization parameters. By knowing that $R_{margin}^{max}$ becomes maximum for $H_{k,total}=0$, the optimization parameters can be determined.

Thus an exemplary embodiment of the enhanced toggle-MRAM device is a magnetic memory element incorporated into a memory device to be operated in a toggle writing mode including a memory layer structure composed of at least two ferromagnetic layers of essentially the same magnetic and structural parameters with a non-magnetic layer in between. There is magnetostatic coupling, with or without exchange coupling, between the two ferromagnetic layers causing the anti-parallel magnetization configuration to be stable when no external magnetic field is applied. The ferromagnetic layers have a shape anisotropy caused by elongation in one direction or an induced uniaxial anisotropy, called 'intrinsic anisotropy'. The easy axis of the shape anisotropy and that of the intrinsic anisotropy are aligned either parallel or perpendicular to each other. The magnetostatic coupling strength, shape anisotropy and intrinsic anisotropy are adjusted so that the magnetoizations of the two layers are most stable when they make an anti-parallel configuration with one preferable direction (called the stabilized direction) in the film plane when no external magnetic field is applied. Between the magnetic parameters called normalized total anisotropy field and magnetic coupling field denoted by $h_{k,total}$ and $h_{couple}$, respectively, there is a relationship:

$$a(h_{couple}-1)+b(h_{couple}-1)^2 < h_{k,total} < 0.05(h_{couple}-1)$$

with $h_{couple}>1$, where a and b are as indicated in Table 1.

Based on the results of the above mentioned analysis, negative $K_{sh}$ is allowed if $K^*$ satisfies the condition:

$$K^*=K_u+(1-r)K_{sh} \geq K_0^*,$$

i.e., $$H_{k,u} \geq H_{k0}^* - (1-r)H_{k,sh}. \quad (16)$$

Therefore, when $H_{k,sh}<0$ is chosen, the intrinsic anisotropy is made greater than $H_{k0}^*$ by at least $(1-r)$ times the absolute value of the shape anisotropy.

From the point of view of obtaining as low an operating field $H_w$ as possible, $H_k^*$ should be chosen as small as possible under the condition $K^* \geq K_0^*$, because $H_w$ is proportional to $H_k^*$, that is, $K^*$ should be set equal to $K_0^*$ ($H_k^*=H_{k0}^*$)

$$h_{k,total}=h_{k,total}^*=1+rh_{k,sh}^*<1 \text{ for } K_{sh}<0 \text{ and } K^*=K_0^*. \quad (17)$$

The condition $h_{k,total}<0$ is attained by making the planar shape of the memory element elongated in one direction so that the easy axis of the shape anisotropy sits in the elongated direction and making the easy axis of the intrinsic uniaxial anisotropy perpendicular direction to the elongated direction (parallel to the short direction), and making the absolute value of the shape anisotropy constant greater than that of the intrinsic anisotropy constant. On the other hand, the condition $h_{k,total}>0$ is attained by making the planar shape of the memory element elongated in one direction so that the easy axis of the shape anisotropy sits in the elongated direction and making the easy axis of the intrinsic uniaxial anisotropy perpendicular direction to the elongated direction, and making the absolute value of the shape anisotropy constant smaller than that of the intrinsic anisotropy constant, or by making the shape anisotropy zero or positive.

Intrinsic uniaxial anisotropy can be induced by applying a magnetic field during the deposition of the magnetic layers or annealing in a magnetic field at a higher temperature than room temperature after deposition. It can also be induced using glancing angle deposition of the magnetic layers so that the layers are composed of elongated nano-particles or by introducing a uniaxial strain in the plane of the magnetic layers through magnetostrictive effect. It can also be induced by means of an epitaxial growth of a magnetic layer on top of a single-crystalline substrate with or without a buffer layer structure on top of it. A high uniaxial anisotropy can be obtained by making a magnetic layer exchange coupled with an antiferromagnetic layer. Similar effect can be obtained in so-called synthetic ferri-magnet, which is comprised of two ferromagnetic layers with different magnetic moments with some metal layer (e.g., Ru, Rh, Cu, etc.) disposed in-between the two ferromagnetic layers. The attenuation factor r is less than unity in principle and can be controlled by changing the thickness of the intermediate layer between the two magnetic layer parts and also by changing the ratio of the thickness to the lateral dimension of the magnetic layer part, typical ratio ranging between 0.5/100 and 5/100. A practically controllable range of the attenuation factor r can be between 0.3 and 0.9.

Applying a bias field in easy axis direction can reduce the necessary operating field. This idea can be applied to the present invention by setting the bias field direction parallel to the stable direction of the anti-parallel magnetization configuration when no external magnetic field is applied, that is, in the x-direction. Further, it is possible to increase the attainable operating field margin for a given operating field. It is to be noted, however, that the application of the bias-field reduces the barrier-energy for the memory retention. $R_{margin}^{max}$ for $H_{k,total}$=0, the condition that provides the maximum potential operating field margin can be obtained from the following relationship deduced from Eqs. (10a,b), (11), and (13c,d):

$$R_{margin}^{max}(h_{bais}, h_{couple}) = \frac{h_{couple} - \sqrt{h_{couple}}}{2\left(\frac{h_{couple} + \sqrt{h_{couple}}}{2} - h_{bias}\right)} \quad (18)$$

with $$h_{w,0}(h_{bias}, h_{couple}) = \frac{1}{\sqrt{2}}\left(\frac{h_{couple} + \sqrt{h_{couple}}}{2} - h_{bias}\right), \quad (19)$$

or $$R_{margin}^{max}(h_{bais,0}, h_{couple}) = \quad (18')$$

$$\frac{h_{couple} - \sqrt{h_{couple}}}{2\left(\frac{h_{couple} + \sqrt{h_{couple}}}{2} - \frac{2h_{bias,0}}{1 + \sqrt{1 + 4h_{bias,0}^2/h_{couple}}}\right)}$$

with $$h_{w,0}(h_{bias,0}, h_{couple}) = \quad (19')$$
$$\frac{1}{\sqrt{2}}\left(\frac{1 + \sqrt{1 + 4h_{bias,0}/h_{couple}}}{2} \cdot \frac{h_{couple} + \sqrt{h_{couple}}}{2} - h_{bias,0}\right).$$

Figure 8:
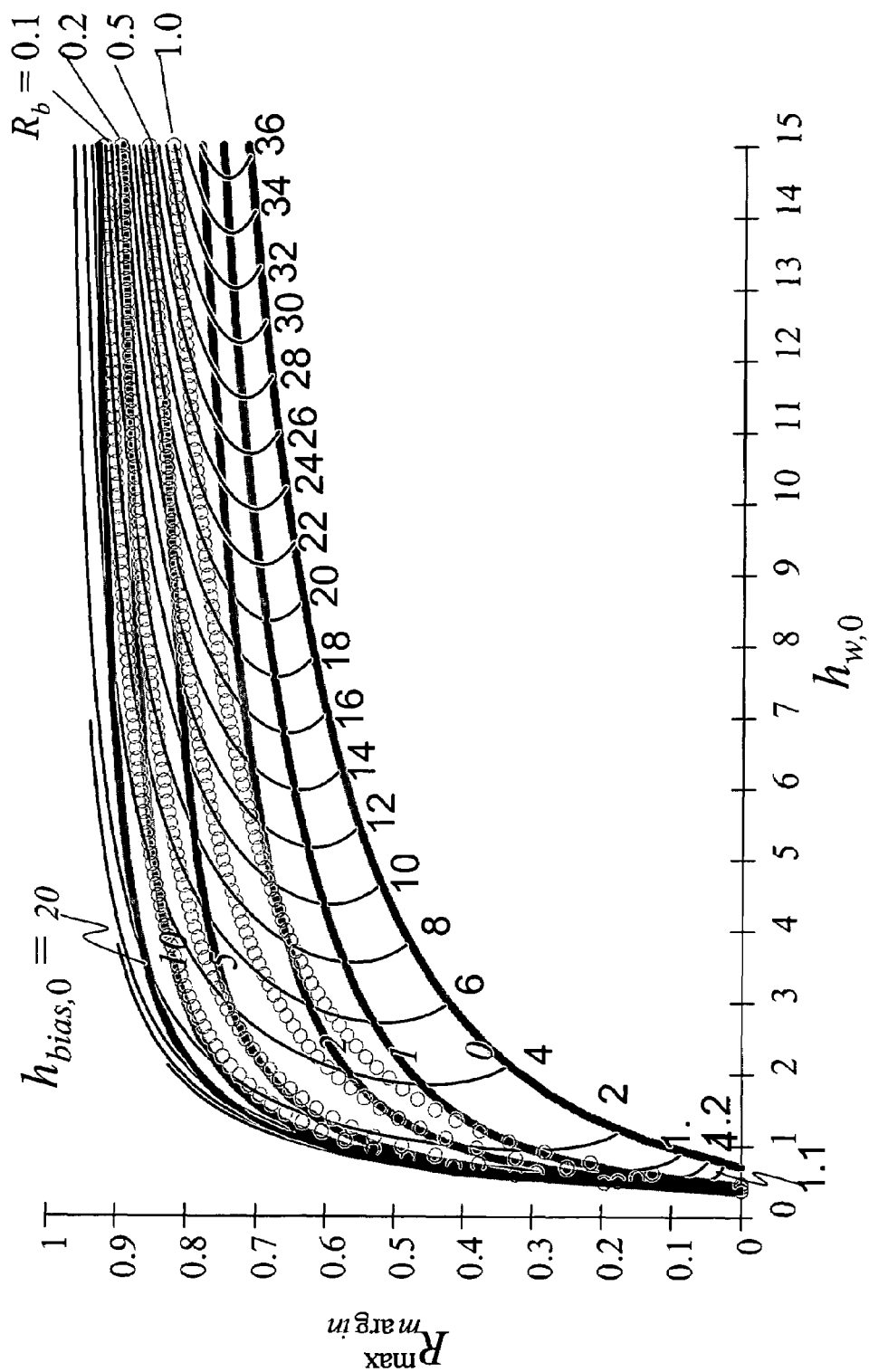
FIG. 8 is a graph showing the maximum relative operating field margin as functions of a normalized operating field with a normalized coupling field and bias field as parameters.
Figure 9:
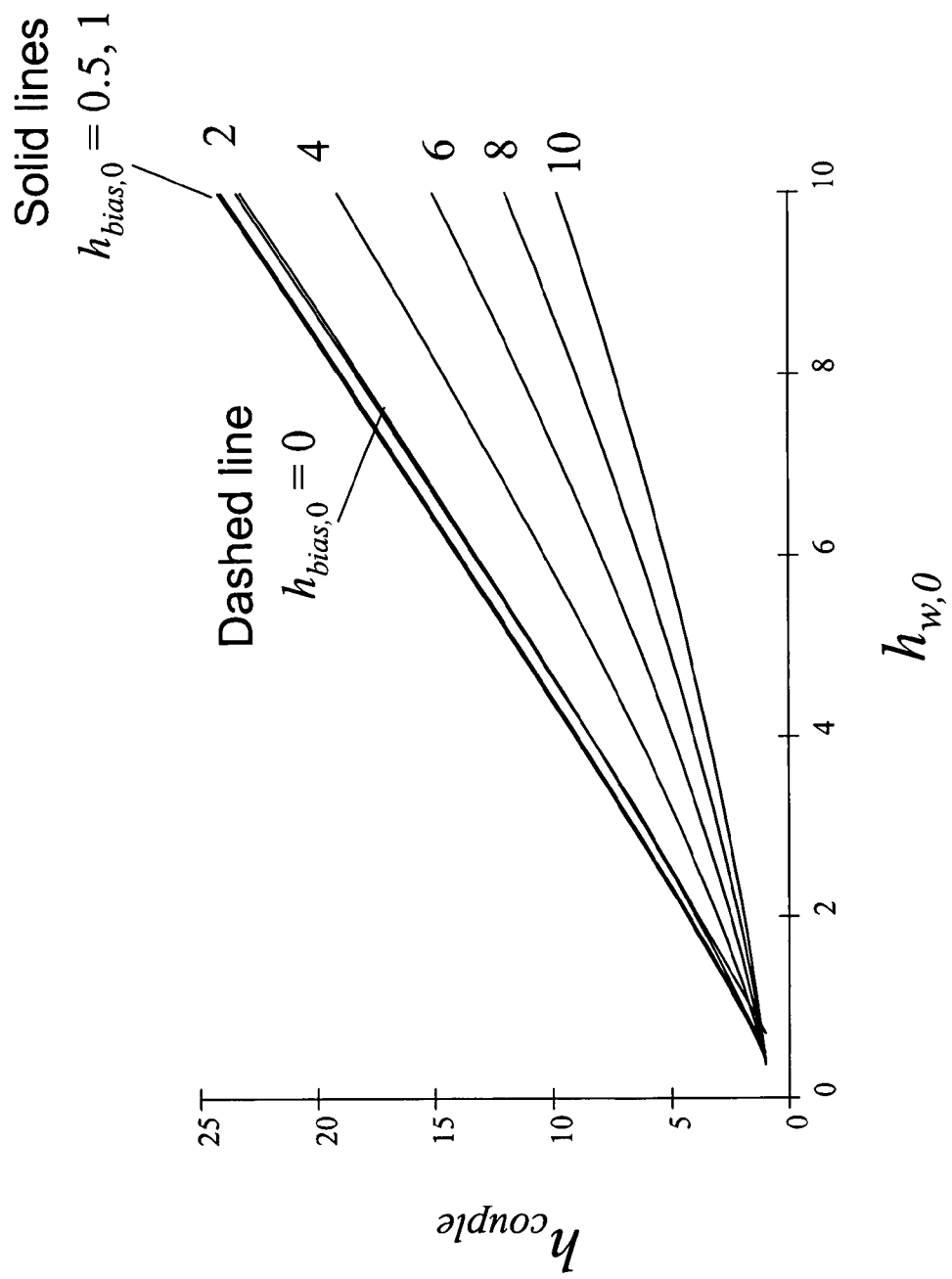
FIG. 9 is showing the optimized normalized coupling field as functions of a normalized operating field with a normalized bias field as a parameter.

Here, $h_{w,0}$ and $h_{bias,0}$ denote $H_w$ and $H_{bias}$ normalized by $H_{k0}^*$. In FIG. 8 $R_{margin}^{max}$ is plotted as functions of $h_{w,0}$ (=$H_w/H_{k0}^*$), with $h_{couple}$ (thin solid black lines) and $h_{bias,0}$ (thick solid gray lines) as parameters. It is to be noted that Eqs. (18') and (19') give the optimized relationship among the $h_{w,0}$, $h_{bias,0}$, and $h_{couple}$, which gives the maximum relative operating field margin. FIG. 9 shows the optimized $h_{couple}$ as functions of $h_{w,0}$, with $h_{bias,0}$ as a parameter. It is required that the bias field should be smaller than $H_{flop}$. That is, it is necessary to set some margin between $H_{bias}$ and $H_{flop}$. Here we define a relative bias-field margin $R_b$, as $$R_b = \frac{H_{flop} - H_{bias}}{H_{bias}}. \quad (20)$$

In FIG. 8, the $R_b$-values to be obtained are also plotted by trains of circles for $R_b$ =0.1, 0.2, 0.5, and 1.0 as indicated in the figure. It is understood how the attainable $R_{margin}^{max}$ decreases with the increase of $R_b$. It is also understood how $R_b$ decreases with the increase of the bias-field, $h_{bias,0}$. In other words, $h_{couple}$ and $h_{bias,0}$ should be chosen for a fixed $R_b$-value as indicated in the figure for each given $h_{w,0}$ in order to realize as great an operating field margin as possible. Referring to Table 2, the optimized $h_{w,0}$-values are shown for given sets of $h_{couple}$ and $R_b$ obtained from FIG. 8.

TABLE 2

| | $R_b$ | | | | |
|---|---|---|---|---|---|
| $h_{couple}$ | 0.1 | 0.2 | 0.3 | 0.4 | 0.5 |
| 1.4 | 5.4 | 2.8 | 1.95 | 1.5 | 1.25 |
| 2 | 5.5 | 2.9 | 2.05 | 1.6 | 1.35 |
| 6 | 6.2 | 3.55 | 2.6 | 2.1 | 1.75 |
| 10 | 6.8 | 4.0 | 3.0 | 2.4 | 2.05 |
| 14 | 7.35 | 4.4 | 3.3 | 2.7 | 2.3 |
| 18 | 7.85 | 4.8 | 3.6 | 2.95 | 2.55 |

Figure 10:
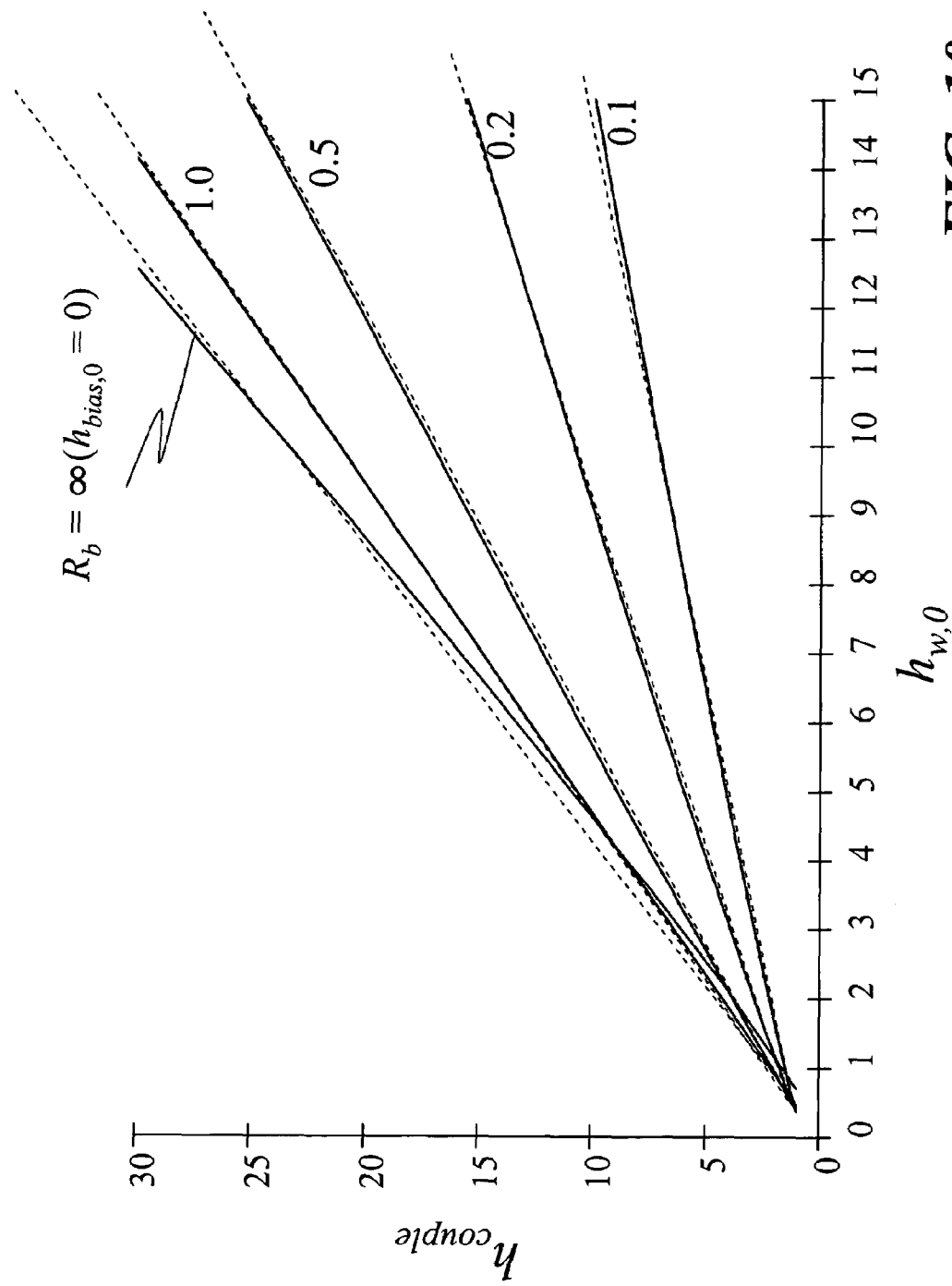
FIG. 10 is a graph showing the optimized normalized coupling field as functions of a normalized operating field with the relative bias field margin as a parameter.

FIG. 10 shows the $h_{w,0}$ dependence of the optimum $h_{couple}$ to be chosen for each bias field (solid line) that results in $R_b$=0.1, 0.2, 0.5, 1.0 and ∞($h_{bias,0}$=0). As shown in the figure by dashed lines, each function can be approximated by a straight line:

$$h_{couple} = \alpha(h_{w,0} - 0.5) + 1.0. \quad (21)$$

Thus, $$h_{w,0} = \frac{h_{couple} - 1}{\alpha} + 0.5. \quad (21')$$

Figure 11:
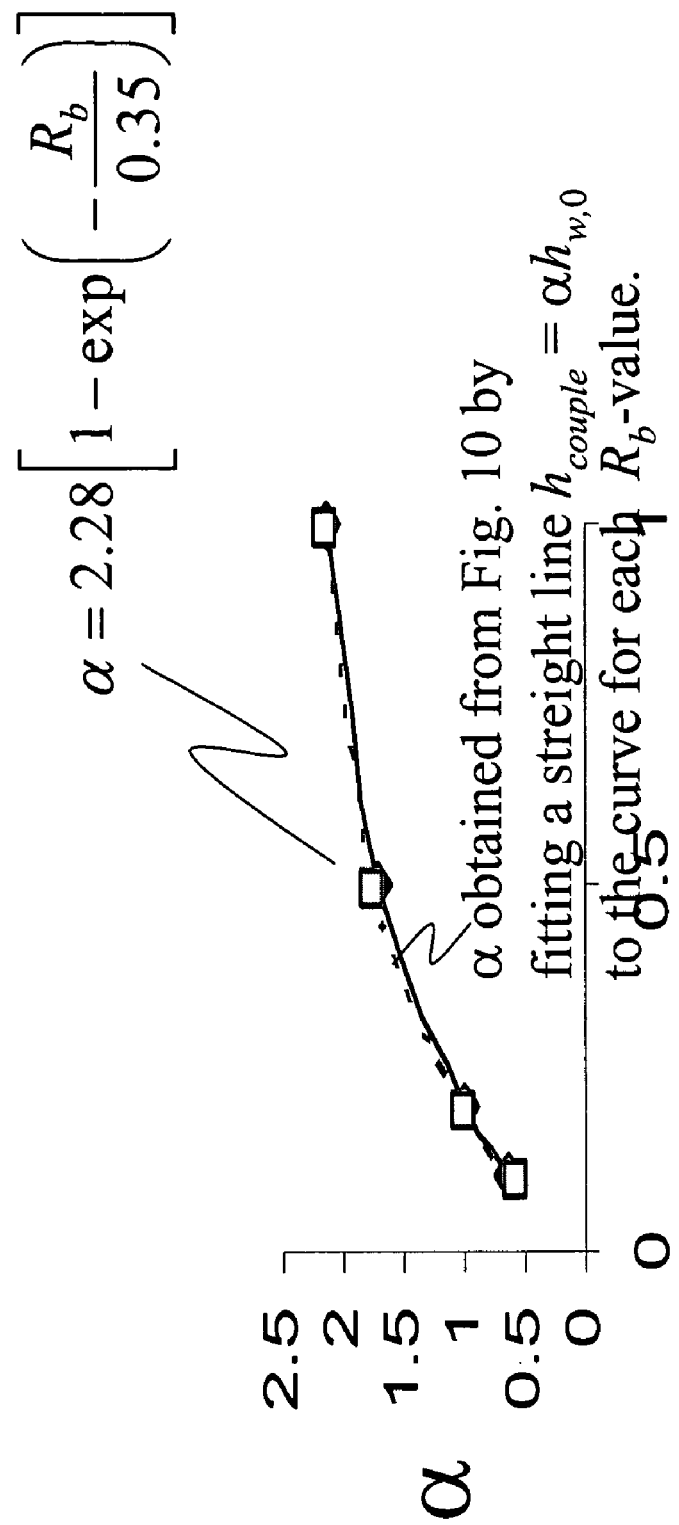
FIG. 11 is a graph showing the coefficient of the relationship between the optimized normalized coupling field and operating field as a function of the relative bias-field margin.

The α-value depends on $R_b$ as shown in FIG. 11. In the figure, the solid line represents the α-value obtained from FIG. 10 and the dashed line is the curve represented by, $$\alpha = 2.28\left[1 - \exp\left(\frac{-R_b}{0.35}\right)\right], \quad (22)$$

$$= 2.28\left[1 - \exp\left(\frac{-1}{0.35}\left(\frac{H_{flop}}{H_{bias}} - 1\right)\right)\right] \text{ by definition (20).}$$

Therefore, in order to obtain, for the optimized condition, $R_b$-value of 0.05, 0.1, 0.2, 0.5, and 1.0, α should be set as 0.30, 0.58, 0.99, 1, 7, and 2. 1 in Eq. (21), respectively. That is, in order to secure the $R_b$-value greater than 0.05, 0.1, 0.2, 0.5, and 1.0, $h_{couple}$ should be set greater than α ($h_{w,0}$−0.5)+1.0, where α is set as 0.30, 0.58, 0.99, 1, 7, and 2. 1, respectively. The $h_{couple}$ v.s. $h_{w,0}$ curve in FIG. 10, for the case where no bias field is applied, was found to be fitted very well by $$h_{couple} \approx -0.82 + 2.28h_{w,0} + 0.013h_{w,0}^2. \tag{23}$$

or $$h_{w,0} \approx 0.37 + 0.43h_{couple} + 0.0008h_{couple}^2, \tag{23'}$$

$$\approx 0.37 + 0.43h_{couple}, \text{ for } h_{couple} < 50.$$

Thus, another exemplary embodiment of the present invention is a memory device operated in a toggle writing mode, the memory element of the first exemplary embodiment being incorporated, and the operating field being controlled, depending on the bias field to be applied, in such a way as $h_{w,0}$ and $h_{couple}$ as defined above hold the relationship expressed by the following equation:

$$h_{w,0} = \frac{h_{couple} - 1}{\alpha} + 0.5,$$

with $\alpha$ as defined above.

Figure 12:
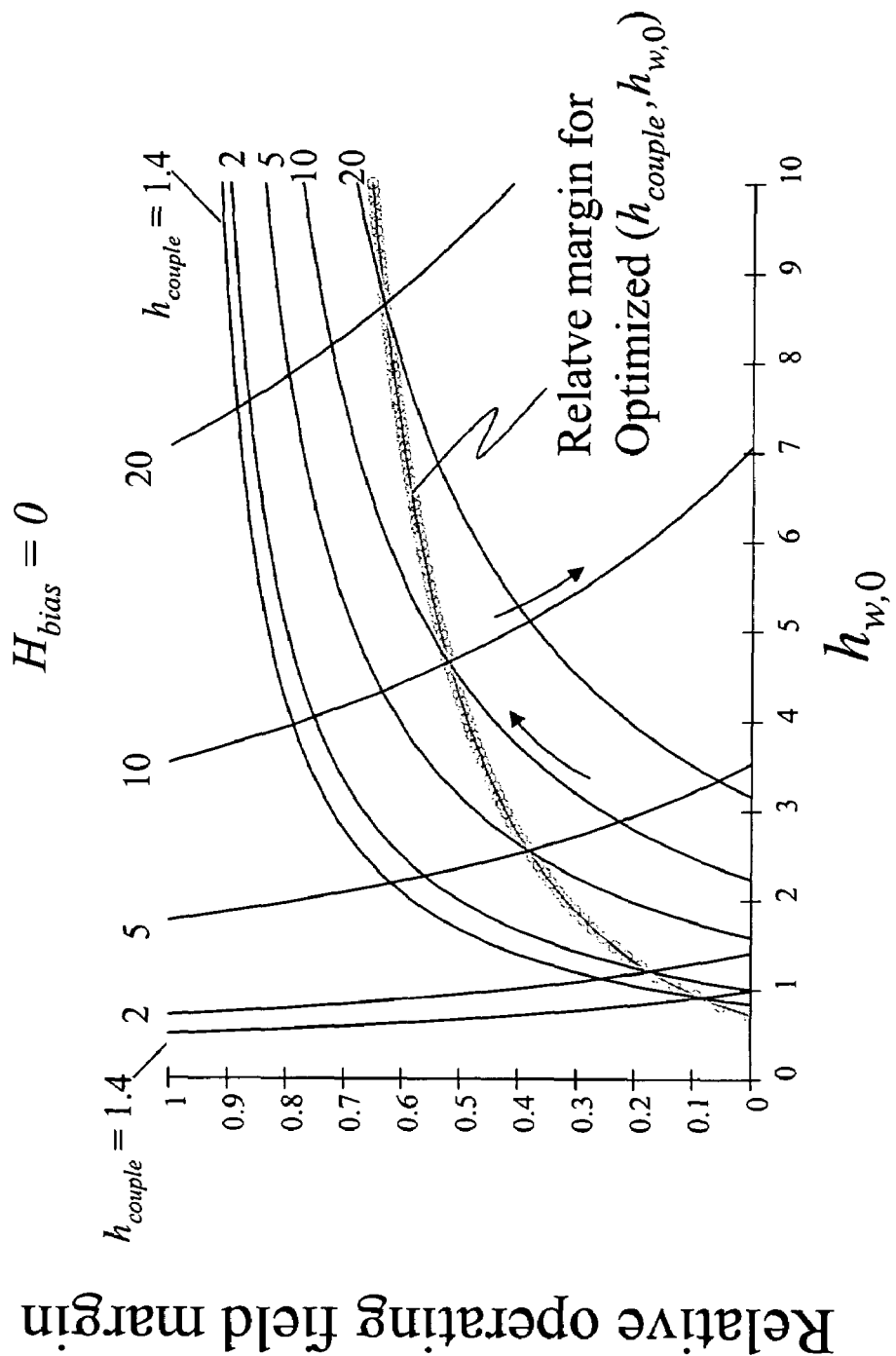
FIG. 12 is the relative inner and outer operating field margins as functions of a normalized operating field with a normalized coupling field as a parameter.

In order to find how the relative operating field margin decreases with the deviation of $h_{w,0}$ and $h_{couple}$ from the optimized values, the dependences of the margin on $h_{w,0}$ and $h_{couple}$ were calculated by using the same model as described above. Some examples of the results are shown in FIG. 12 for the case where no bias field is applied. In the figure, the relative operating field margin is plotted as functions of $h_{w,0}$ with $h_{couple}$ as a parameter. The solid curves are for the margin between $H_{flop}$ and $\sqrt{2} H_{w,0}$ and the dashed curves are for the margin between $\sqrt{2} H_{w,0}$ and the saturation field $H_{x,s}$. The actual margin is the smaller of the two margins for each $h_{couple}$. It is seen that for each $h_{couple}$, the relative margin first increases and then decreases with the increase of $h_{w,0}$ with a maximum at an optimal $h_{w,0}$, as shown by arrows for $h_{couple}=10$ as an example. The dots represent the margin for the optimized $h_{w,0}$ for each $h_{couple}$, which make the same curve as $R_{margin}^{max}$ for $h_{bias}=0$ shown in FIG. 8. It is seen how the relative margin decreases with the deviation of $h_{w,0}$ from its optimal value. A noticeable characteristic of the decay of the relative margin is that it is stronger in the positive direction than in the negative direction. Similar tendency was confirmed for the case where a bias field is applied. In practical applications, it is inevitable to have some dispersion in any parameters. The above facts suggest that it is much more advantageous to shift the center of the distribution of the $h_{w,0}$ values in the negative direction rather than to the positive direction.

Figure 13:
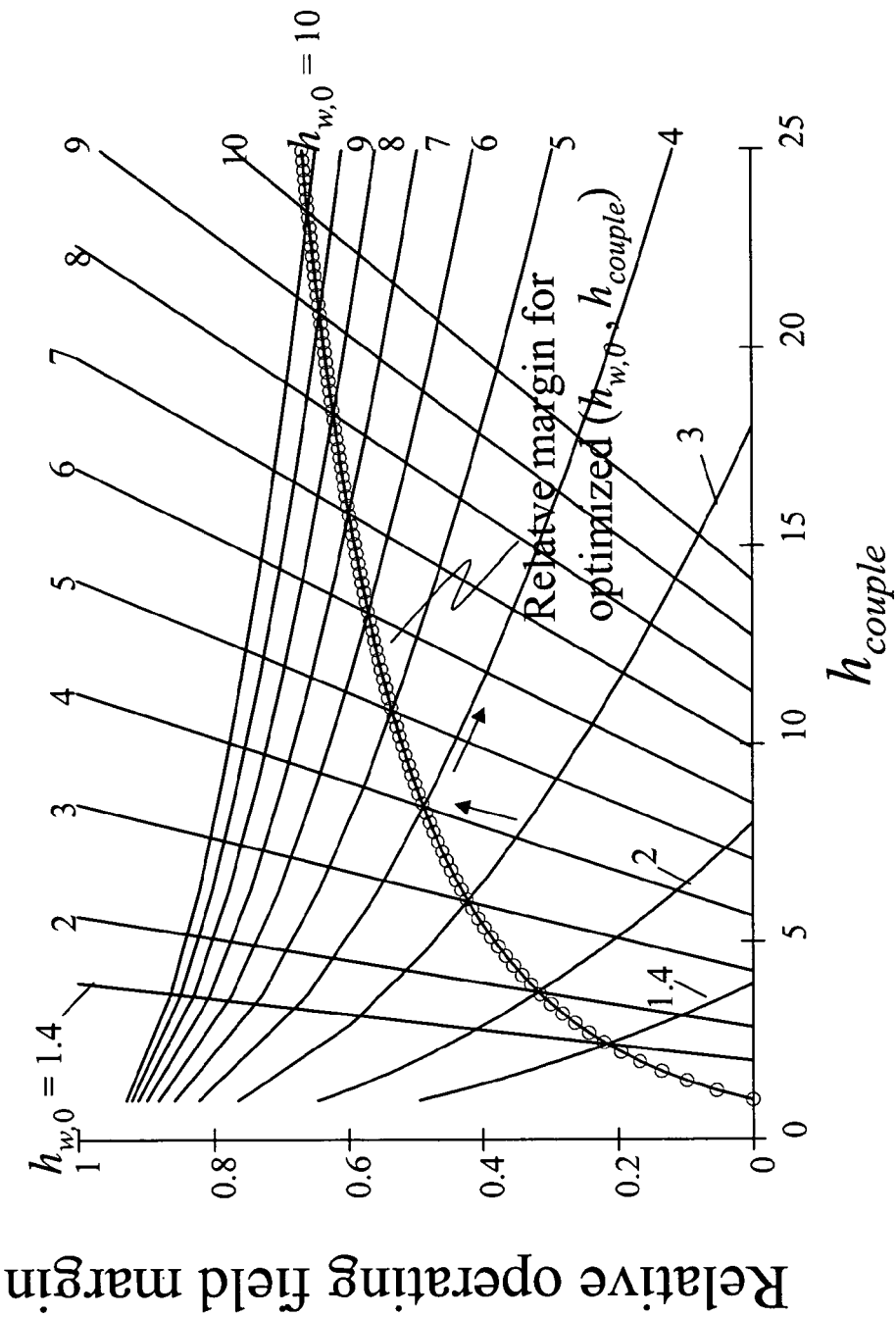
FIG. 13 is the relative operating field margin as functions of a normalized coupling field with a normalized operating field as a parameter.

On the other hand, FIG. 13 shows the same two kinds of margin for $h_{bias}=0$ as above as functions of $h_{couple}$ with $h_{w,0}$ as a parameter. The dots show the relative operating field margin for the optimized $h_{couple}$ for each $h_{w,0}$. It is seen how the relative operating field margin decreases with the deviation of $h_{couple}$ from each optimized value for a given $h_{w,0}$, as is shown by the arrows for $h_{w,0}=4$ as an example. A noticeable characteristic nature this time is that the decay of the relative margin with the deviation from the optimal value of $h_{couple}$ is much stronger in the negative direction than in the positive direction. This suggests that it is advantageous to shift the center of the $h_{couple}$ value distribution in the positive direction rather than to the negative direction.

Figure 14A:
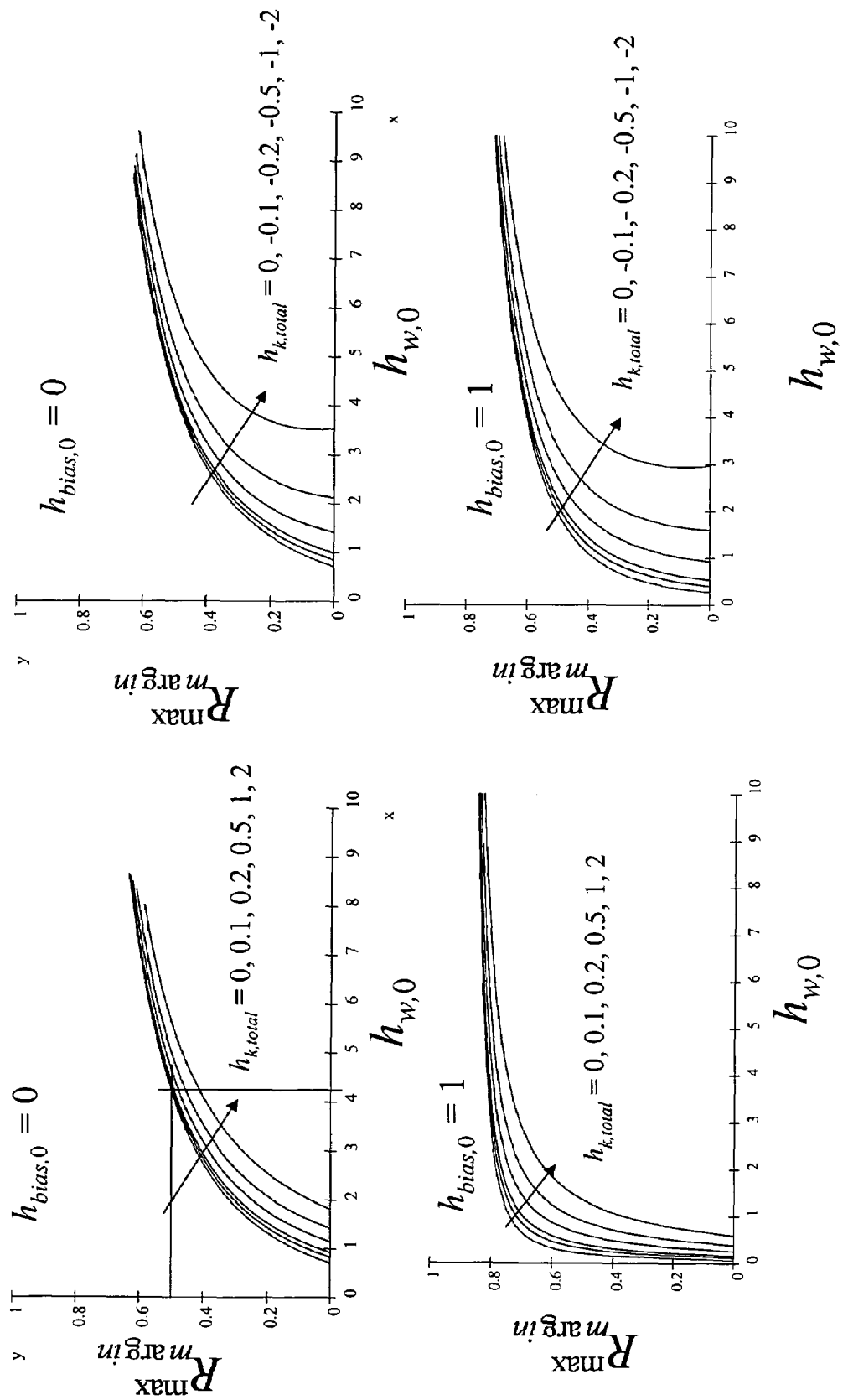
FIG. 14a is a set of graphs showing a set of examples of graphs of maximum relative operating field margin as functions of normalized operating field with the normalized total anisotropy field as a parameter for different bias field.
Figure 14B:
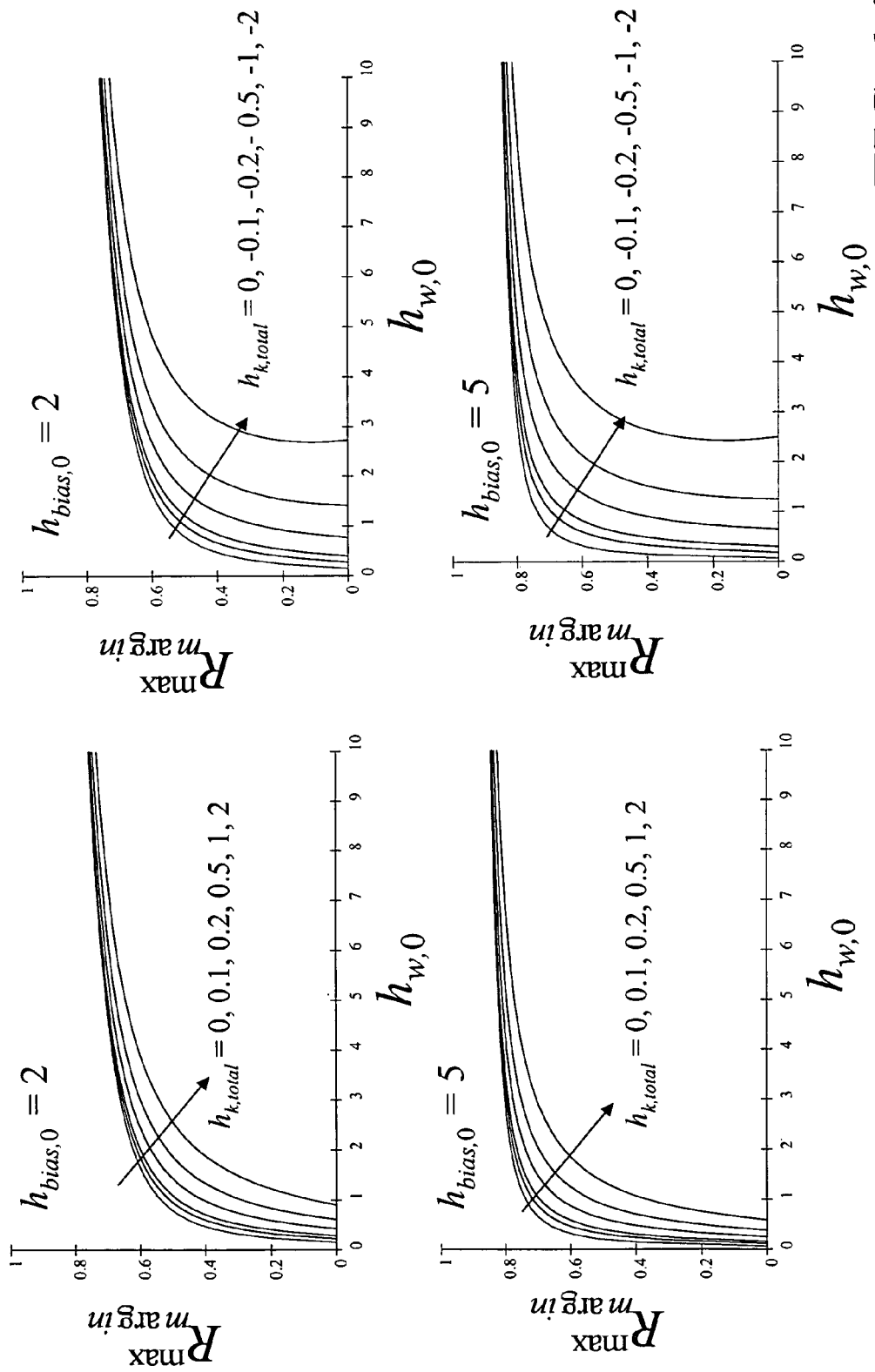
FIG. 14b is a set of graphs showing another set of examples graphs of maximum relative operating field margin as functions of normalized operating field with the normalized total anisotropy field as a parameter for different bias field.

FIG. 14a and FIG. 14b show how the dependence of the operating field margin $R_{margin}^{max}$ upon the operating field $h_{w,0}$ changes with the total anisotropy field $h_{k,total}$ for different bias field $h_{bias,0}$. As shown for the bias fields in FIGS. 14a and 14b, the operating field margin starts to appear from the lowest operating field giving always the greatest margin for the same operating field when $h_{k,total}$ is zero. This indicates that by setting the total anisotropy as close to zero as possible, the operating field can be made the smallest with the greatest margin.

According to FIG. 8, and FIG. 14a and FIG. 14b, the greater the $h_{w,0}$, the greater operating field margin is available. However, there are some restrictions in $H_{k,0}^*$ and $H_{w,0}$ due to the desire for thermal stability of the memory element and the applicable current to generate the operating field $H_w$, respectively. Because by definition, $$h_{w,0} = \frac{H_w}{H_{k,0}^*}, \tag{24}$$

from the point of view of keeping the operating field $H_w$ as small as possible for the same $h_{w,0}$, $H_{k,0}^*$ is to be made as small as possible. However, $H_{k,0}^*$ is given by Eq. (15'). As known to one of ordinary skill in the art, it is preferable that $H_w$ is lower than 150 Oe, and even more preferably, lower than 100 Oe. Therefore, the preferable $h_{w,0}$ is less than $150/H_{k,0}^*$, and more preferable less than $100/H_{k,0}^*$, with $H_{k,0}^*$ being measured in Oe. For most of the MRAM devices, the factor $\ln(f_0\tau_c)$ can be between 50 and 70 giving the numerator the value of $3\sim4\times10^{-12}$ for the typical operating temperature T of about 400K. Therefore, $H_{k,0}^*$ is given by $$H_{k0}^* = \frac{3\sim 4\times 10^{-12}}{M_s V} \tag{25}$$

This leads to the requirement which $M_s$, $V$, and $H_w$ should satisfy:

$$M_s H_w V = 3\sim 4\times 110^{-12} h_{w,0} \text{ emu} \tag{26}$$

When the upper limit of the available operating field is about 100 Oe, then the minimum allowable $M_s V$ value is, $$M_s V = 3\sim 4\times 10^{-14} h_{w,0} \text{ emu} \tag{26'}$$

Typical requirement for the operating field margin is >0.2. Without a bias field, FIG. 14a reads the critical $h_{w,0}$ is 1.3 and 4.2 for $h_{k,total}=0$, respectively, giving the restriction requirement, $$M_s V > 4\sim 5\times 10^{-14} \text{ emu},$$

Therefore, in order to make the volume of the element as small as possible, which is the requirement for increasing the memory density, the magnetization of the element should be made as large as possible. For a typical magnetic material commonly being used in the development of the MRAM is about 1500 emu/cm$^3$. Therefore, the minimum volumes allowable for the above conditions are $2.5\sim3.5\times10^{-17}$ cm$^3$. It is clear from FIG. 14a and FIG. 14b showing the case where bias field is applied that, by using the bias field, the attainable volume can be made substantially smaller than the case without biasing, or keeping the volume, the margin can be made much larger.

As was described above, r<0.9. Therefore, the induced anisotropy should be made greater than $K_0^*$, when $H_{k,sh}$ is negative. Thus, taking into account equation Eq. 25, the following condition results:

$$K_u > \frac{4 \times 10^{-12}}{V} \qquad (27)$$

For V between $10^{-17}$ and $10^{-15}$ cc, $K_u$ should be controlled between $4 \times 10^5$ and $4 \times 10^3$ erg/cm$^3$. This condition is especially severe for the higher value, which should be attained for realizing the smaller volume element. At present, in the field of magnetic thin film memories, the magnetic materials being used is in the category of so called 'soft magnetic' materials, where the magnetic anisotropy is at the highest some $10^4$ erg/cm$^3$. The materials with a magnetic anisotropy greater than $10^5$ erg/cm$^3$ are called 'hard magnetic' materials, which are familiar in the field of permanent magnets and magnetic recording media. One of the conceivable methods to attain a high anisotropy magnetic layer is to apply a technique familiar in the field of magnetic recording thin film media. Another conceivable method is to apply the oblique incident or glancing angle vapor deposition method. Another conceivable method is utilizing self aligned copolymer coating as a template for deposition of high crystalline anisotropy magnetic materials such as either Co—Fe alloy of hexagonal or body centered cubic structure with some additives such as Pt, Pd, etc. Another conceivable method is making the magnetic layers exchange coupled with an antiferromagnetic layer or with a ferromagnetic layer thorough a nonmagnetic layer of Ru, Rh, Cu, etc. making a so called synthetic ferri-magnet.

$H_{k,total}=0$ can be obtained by equating the planar shape of the memory element elongated in one direction so that the easy axis of the shape anisotropy sits in the elongated direction and making the easy axis of the intrinsic uniaxial anisotropy perpendicular direction to the elongated direction (parallel to the short direction), and making the absolute value of the shape anisotropy constant equal to the intrinsic anisotropy constant, that is $K_u = |K_{sh}|$. Then, when the effective anisotropy $K^*$ is set equal to $K^*_0$ to make the operating field as small as possible, $r|K_{sh}| = K_0^*$.

Figures 15A, 15B, 15C:
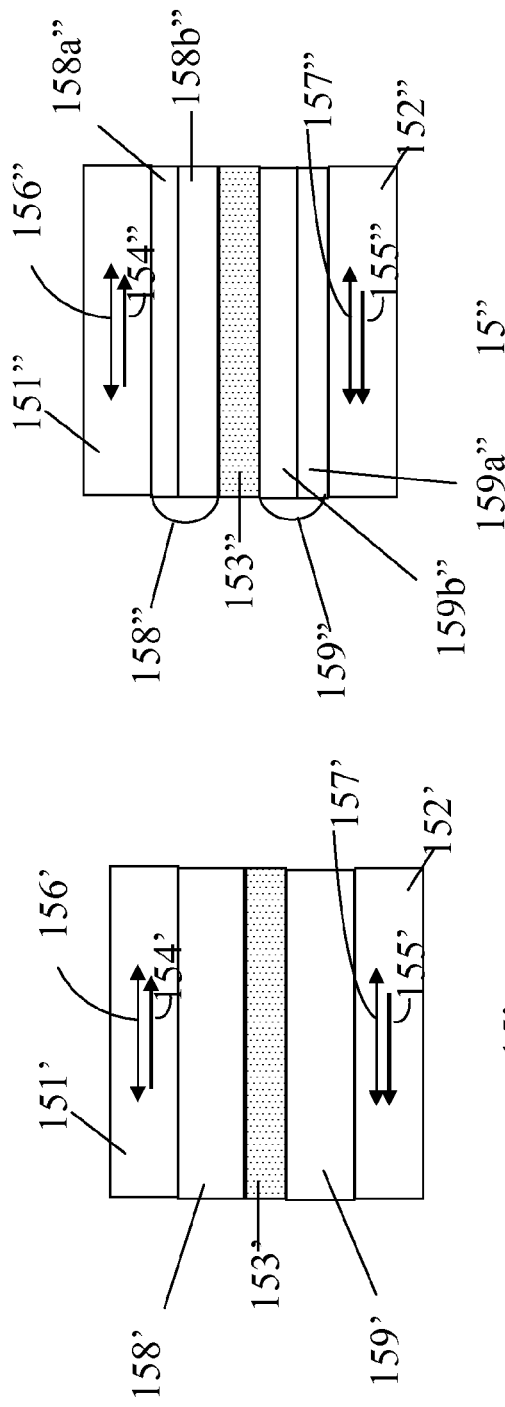
FIGS. 15a, 15b, and 15c are cross-sectional views of conceptual structures of embodiments of the present invention.

FIGS. 15a, 15b, 15c and FIG. 16 show cross-sectional views and a plan view of a conceptual structure of one of embodiments according to the present invention. The memory-element 15 (16) is comprised of a first magnetic layer structure 151 and a second magnetic layer structure 152 with a non-magnetic layer structure 153 substantially disposed in between the first 151 and second 152 magnetic structures. The magnetic layers 151 and 152 possess uniaxial anisotropy whose easy axes 156 (166) and 157 (167) are set in the short axis direction (x-direction). Anti-parallel coupling effect exists through the magnetostatic coupling and/or exchange coupling between the two layer parts 151 and 152. The magnetic layer structure can be either a single layer or a composite layer, such as a ferromagnetic layer exchange coupled with an antiferromagnetic layer or with another ferromagnetic layer making a synthetic ferri-magnetic layer. FIG. 15b and FIG. 15c depict the cross-section of the composite structure schematically. The memory-element 15' (15") and is composed of a first magnetic layer part 151' (151") and a second magnetic layer part 152' (152") with a non-magnetic layer part 153" (153") in between. The magnetic layers 151' (151") and 152' (152") possess uniaxial anisotropy whose easy axes 156' (156") and 157' (157") are set in the short or long axis direction (x-direction). Anti-parallel coupling effect exists through the magnetostatic coupling between the two layer parts 151' (151") and 152' (152"). 158' and 159' are antiferromagnetic layers stabilizing the magnetization of the adjacent magnetic layers in the x-direction by exchange coupling. 158" and 159" are composite structures composed of a ferromagnetic layer 158b" (159b") and non-magnetic layer 158a" (158a") consisting a so-called "antiferrimagnet" with the adjacent magnetic layers 151" or 152".

Figure 17:
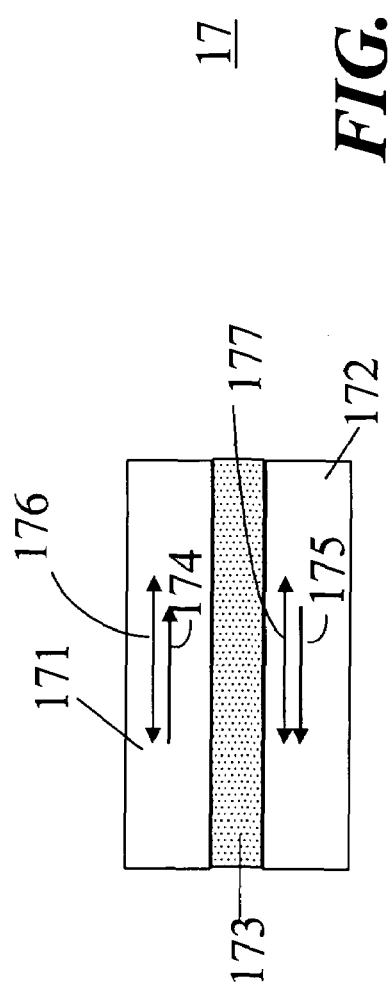
FIG. 17 is a cross-sectional view of a conceptual structure of other embodiments of the present invention.
Figure 18:
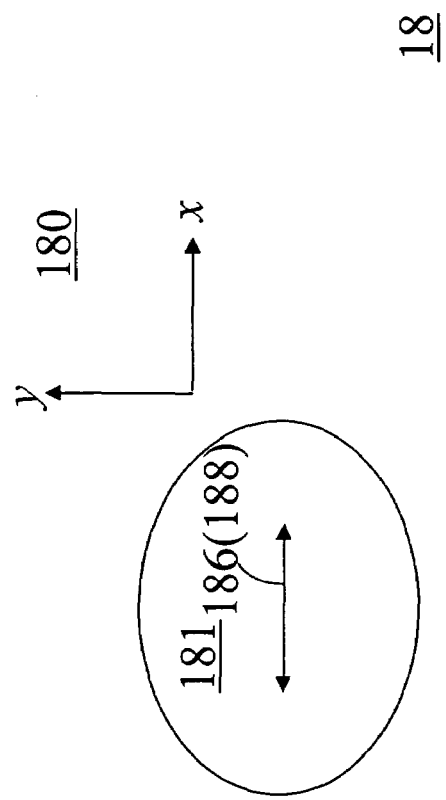
FIG. 18 is a plan view of the conceptual structure of the embodiment of the present invention whose cross-sectional view is shown in FIG. 17.

FIG. 17 and FIG. 18 show a cross-sectional view and a plan view of a conceptual structure of another embodiment according to the present invention. The memory-element 17 (18) is composed of a first magnetic layer structure 171 and a second magnetic layer structure 172 with an interlayer structure 173 disposed substantially in between the first and second magnetic structures. The magnetic layers 171 and 172 possess uniaxial anisotropy whose easy axes 177 (186) and 178 (188) are set in the long axis direction (x-direction). Anti-parallel coupling effect exists through the magnetostatic coupling and/or exchange coupling between the two layer parts 171 and 172.

Figure 19:
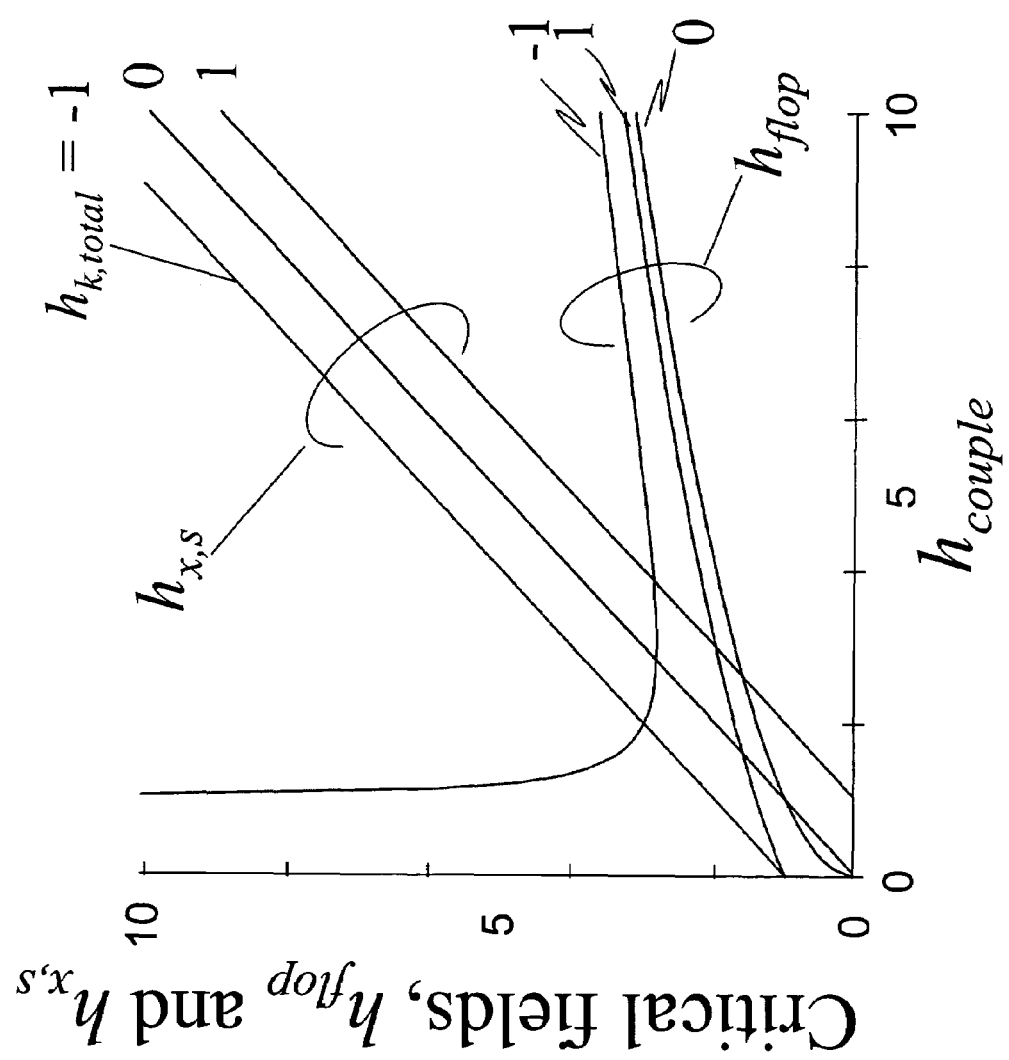
FIG. 19 is a graph showing the normalized characteristic critical fields as functions of the normalized coupling field for some of the embodiments of the present invention.

FIG. 19 shows the dependence of $h_{flop}$ and $h_{x,s}$ on $h_{couple}$ for several embodiments of the present invention, in which $h_{k,total}$ was set at −1, 0, and 1, respectively. The operating field margin is the span between $h_{flop}$ and $h_{x,s}$. Substantial enhancement of the operating field margin is seen with decreasing the absolute value of $h_{k,total}$, especially in relatively small $h_{couple}$ region. Concerning $H_{couple}$, it is defined by Eq. (7). When the thickness t is much smaller than the diameter of the element, which is the case for most of the MRAM elements under consideration, $H_{couple}$ can be roughly estimated by $$H_{couple} = \frac{2J}{M_s t} + 4\pi r M_s \frac{t}{D}, \qquad (28)$$

where D is the average diameter of the element. As was described above, the relevant $H_{k0}^*$ is between several tens to the several hundred Oe, and if we restrict ourselves to a relatively low $h_{w,0}$ from the view point of obtaining a low operating field, the relevant $h_{couple}$ value is less than approximately 15. The exchange coupling constant J of the first term in (27) comes from the interaction of the two magnetic layers through the intermediate conductive layer. An example can include antiferromagnetic coupling through Ru and Rh mostly greater than 0.5 erg/cm$^2$, which gives the contribution of approximately several hundred to approximately several thousand Oe for typical $M_s t$ value, while the second term coming from the magnetostatic coupling between the two magnetic layers less than about 1000r Oe, which also stabilizes the antiparallel magnetization configuration.

Therefore, in order to obtain a rather lower coupling strength, it is necessary to reduce the antiferromagnetic exchange coupling strength substantially, or rather make it into a ferromagnetic coupling (with a negative J-value), because the magnetostatic coupling is always anti-ferromagnetic. Examples of materials for this object can include, but are not limited to, Ru, Rh, Ir, Cu, Al, Ag, Pt, Mn, Ta, and Ti and their alloys, ferromagnetic materials such as Fe, Ni, Co and metallic alloys or mixtures including those, and their alloys with or without diluting materials such as Cu, Al, Cr, Ag, Pt, Mn, Ta, and Ti. The magnetostatic coupling should also be reduced substantially. The magnetostatic coupling strength can be reduced by increasing the separation between the two magnetic layer structures. The bias field can be applied by means of setting a permanent magnet including a ferromagnetic pinned layer structure exchange coupled with an antiferromagnetic layer.

Figure 20A:
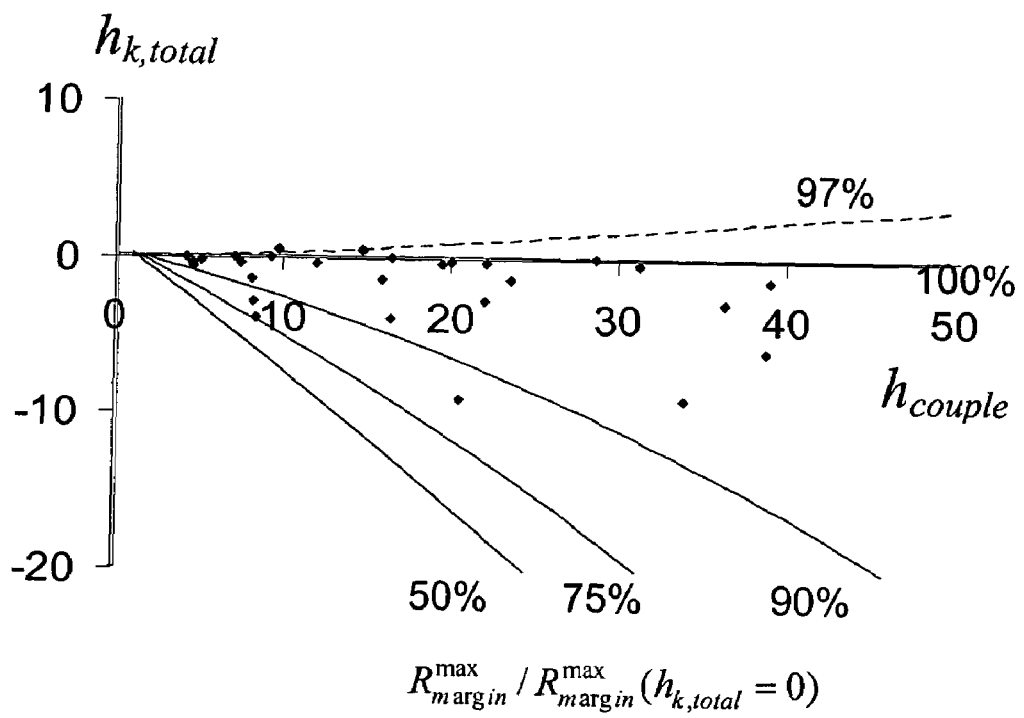
FIG. 20a illustrates the normalized total anisotropy field $h_{k,total}$ and normalized coupling field $h_{couple}$ of the embodiments described in Tables 3 and Table 4 are plotted in the $h_{couple}$-$h_{k,total}$ plane for the case of $M_s$=approximately 1500 emu/cm$^3$.
Figure 20B:
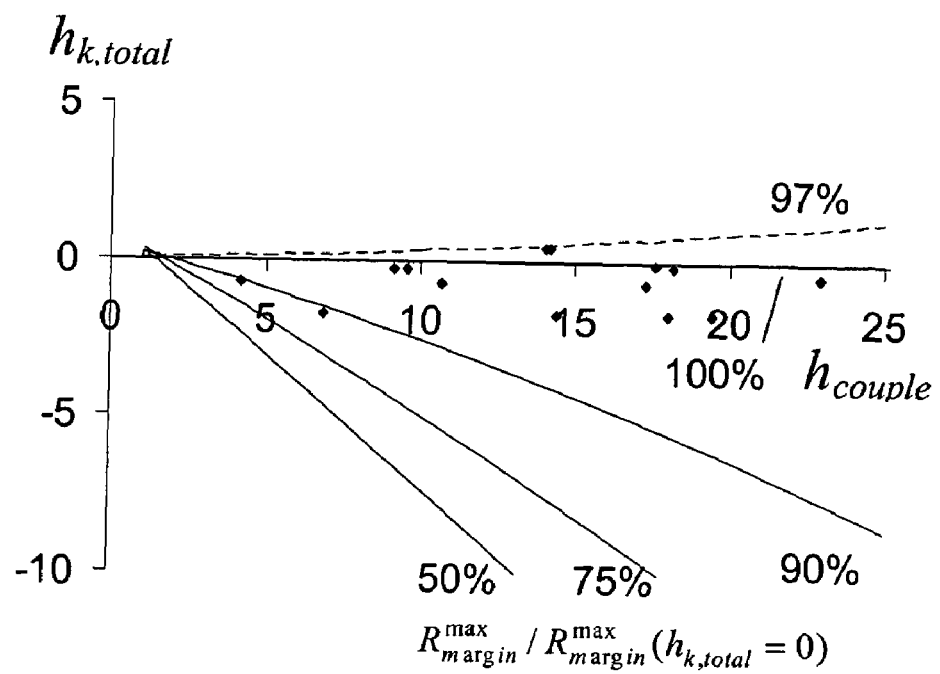
FIG. 20b illustrates the normalized total anisotropy field $h_{k,total}$ and normalized coupling field $h_{couple}$ of the embodiments described in Tables 3 and Table 4 are plotted in the $h_{couple}$-$h_{k,total}$ plane for the case of $M_s$=approximately 850 emu/cm$^3$.

In Table 3 and Table 4 are listed the parameters and the properties of some embodiments according to the present invention. Table 3 is for embodiments in which the saturation magnetization $M_s$ of the magnetic layers is 1500 emu/cm³, and Table 4 is for embodiments in which saturation magnetization $M_s$ of the magnetic layers is 850 emu/cm³. In the tables, a, ρ and t denote the shorter diameter, aspect ratio and thickness of each magnetic layer, respectively and s denotes the separation length between the two magnetic layers consisting the memory element. It should be noted that deposited magnetic layers have more or less so called a dead-layer, which does not have a magnetic moment, and the thickness of which $t_{dead}$ is usually in the range of 1+/− several tenths nm. Therefore, the thickness denoted by t must be regarded as the net thickness which is the deposited thickness $t_{dep}$ minus the total dead layer thickness $t_{dead,\,total}$, $t = t_{dep} - t_{dead,\,total}$. In the same way, the separation s includes the dead layer thickness existing between the two magnetic layers. The normalized total anisotropy field $h_{k,total}$ and normalized coupling field $h_{couple}$ of the embodiments shown in the Table 3 and Table 4 are ploted in the $h_{couple}$-$h_{k,total}$ plane in FIGS. 20a and b; FIG. 20a, for the cases of $M_s$=1500 emu/cm³ and FIG. 20b, for the cases of $M_s$=850 emu/cm³. In the figures, four curves corresponding to the curves shown in FIG. 7c are also shown.

TABLE 3

Ms = 1500 emu/cm³

| a (nm) | ρ | t (nm) | s (nm) | $H_{ku}$ (Oe) | J (erg/cm²) | $h_{,ktotal}$ | $h_{couple}$ | $R_{margin}^{max}$ |
|---|---|---|---|---|---|---|---|---|
| 400 | 1.2 | 2 | 0.8 | 20 | 0.02 | −0.5 | 31 | 0.7 |
| 400 | 1.2 | 2 | 0.8 | 20 | 0 | −0.5 | 19 | 0.6 |
| 400 | 1.2 | 2 | 0.8 | 20 | −0.02 | −0.5 | 12 | 0.5 |
| 400 | 1.2 | 2 | 0.8 | 20 | −0.03 | −0.5 | 4.4 | 0.2 |
| 400 | 1.2 | 2 | 0.8 | 20 | −0.02 | −0.5 | 7.3 | 0.4 |
| 400 | 1.1 | 2.5 | 5 | 20 | 0.04 | −1.4 | 70 | 0.8 |
| 400 | 1.1 | 2.5 | 5 | 20 | 0 | −1.4 | 39 | 0.7 |
| 400 | 1.1 | 2.5 | 5 | 20 | −0.02 | −1.4 | 23 | 0.7 |
| 400 | 1.1 | 2.5 | 5 | 20 | −0.03 | −1.4 | 16 | 0.6 |
| 400 | 1.1 | 2.5 | 5 | 20 | −0.04 | −1.4 | 8 | 0.5 |
| 400 | 1.1 | 2.5 | 5 | 25 | 0 | −0.3 | 22 | 0.6 |
| 400 | 1.1 | 2.5 | 5 | 25 | −0.04 | −0.6 | 4.5 | 0.3 |
| 400 | 1.1 | 2.5 | 5 | 40 | 0 | 0.4 | 9.5 | 0.5 |
| 400 | 1.1 | 3.5 | 3.5 | 20 | 0.07 | −3.9 | 128 | 0.8 |
| 400 | 1.1 | 3.5 | 3.5 | 20 | 0 | −3.9 | 72 | 0.8 |
| 400 | 1.1 | 3.5 | 3.5 | 20 | −0.03 | −3.9 | 52 | 0.8 |
| 400 | 1.1 | 3.5 | 3.5 | 20 | −0.07 | −3.9 | 16 | 0.6 |
| 400 | 1.1 | 3.5 | 3.5 | 20 | −0.08 | −3.9 | 8.2 | 0.5 |
| 400 | 1.1 | 3.5 | 3.5 | 25 | 0 | −2.8 | 36 | 0.7 |
| 400 | 1.1 | 3.5 | 3.5 | 25 | −0.07 | −2.8 | 8.1 | 0.5 |
| 400 | 1.1 | 3.5 | 3.5 | 40 | 0 | 0.4 | 14 | 0.6 |
| 400 | 1.1 | 5 | 2 | 20 | 0 | −9.1 | 167 | 0.9 |
| 400 | 1.1 | 5 | 2 | 20 | −0.11 | −9.1 | 67 | 0.8 |
| 400 | 1.1 | 5 | 2 | 20 | −0.15 | −9.1 | 34 | 0.7 |
| 400 | 1.1 | 5 | 2 | 20 | −0.17 | −9.1 | 20 | 0.7 |
| 400 | 1.1 | 5 | 2 | 30 | 0 | −5.9 | 39 | 0.7 |
| 400 | 1.1 | 5 | 2 | 40 | 0 | −2.8 | 22 | 0.6 |
| 200 | 1.1 | 2.5 | 0.4 | 35 | 0 | −0.3 | 20 | 0.6 |
| 200 | 1.1 | 2.5 | 0.4 | 35 | −0.06 | −0.3 | 5 | 0.3 |
| 200 | 1.1 | 2.5 | 0.4 | 40 | 0.06 | −0.1 | 28 | 0.7 |
| 200 | 1.1 | 2.5 | 0.4 | 40 | 0 | −0.1 | 16 | 0.6 |
| 200 | 1.1 | 2.5 | 0.4 | 40 | −0.04 | −0.1 | 9.1 | 0.5 |
| 200 | 1.1 | 2.5 | 0.4 | 40 | −0.05 | −0.1 | 6.9 | 0.4 |
| 200 | 1.1 | 2.5 | 0.4 | 40 | −0.06 | −0.1 | 4.1 | 0.2 |

TABLE 4

Ms = 850 emu/cm³

| a (nm) | ρ | t (nm) | s (nm) | $H_{ku}$ (Oe) | J (erg/cm²) | $h_{,ktotal}$ | $h_{couple}$ | $R_{margin}^{max}$ |
|---|---|---|---|---|---|---|---|---|
| 400 | 1.1 | 2.5 | 1 | 15 | 0 | −0.1 | 17 | 0.6 |
| 400 | 1.1 | 2.5 | 2.5 | 15 | 0 | −0.1 | 18 | 0.6 |
| 400 | 1.1 | 3.5 | 1.4 | 15 | 0 | −1 | 28 | 0.7 |
| 400 | 1.1 | 3.5 | 1.4 | 20 | −0.03 | −0.2 | 9.6 | 0.5 |
| 400 | 1.1 | 3.5 | 3.5 | 15 | 0 | −1 | 32 | 0.7 |
| 400 | 1.1 | 3.5 | 3.5 | 20 | −0.03 | −0.2 | 9.1 | 0.5 |
| 400 | 1.1 | 5 | 2 | 15 | 0 | −2.8 | 54 | 0.8 |
| 400 | 1.1 | 5 | 2 | 20 | −0.04 | −1.7 | 18 | 0.6 |
| 400 | 1.1 | 5 | 2 | 30 | 0 | 0.4 | 14 | 0.6 |
| 400 | 1.1 | 5 | 5 | 15 | 0 | −2.8 | 85 | 0.8 |
| 400 | 1.1 | 5 | 5 | 20 | −0.04 | −1.7 | 19 | 0.6 |
| 400 | 1.1 | 5 | 5 | 20 | −0.05 | −1.7 | 14 | 0.6 |
| 400 | 1.1 | 5 | 5 | 30 | 0 | 0.4 | 14 | 0.6 |
| 400 | 1.1 | 5 | 5 | 20 | −0.08 | −1.7 | 6.8 | 0.4 |

It was found that the application of the word and digit field in the direction making an angle greater than 45° with respect to the easy axis is advantageous when $h_{k,total}$ is positive. The application of the word and digit field in the direction making an angle less than 45° with respect to the easy axis is advantageous when $h_{k,total}$ is negative which are effective to enhance the operating field margin.

The fabrication process of the layer structure of the present invention can be any of the film deposition techniques such as vacuum sputtering, vacuum vapor deposition, chemical vapor deposition and electro-deposition well known to the field of film fabrication.

Although several aspects of the present invention have been disclosed in the foregoing specification, it is understood by those skilled in the art that many modifications and other aspects of the invention will come to mind to which the invention pertains, having the benefit of the teaching presented in the foregoing description and associated drawings. It is thus understood that the invention is not limited to the specific aspects disclosed hereinabove, and that many modifications and other aspects are intended to be included within the scope of the appended claims. Moreover, although specific terms are employed herein, as well as in the claims which follow, they are used only in a generic and descriptive sense, and not for the purposes of limiting the described invention.

What is claimed is:

1. A magnetic memory device comprising:
   one or more memory layer structures having an anti-parallel magnetization configuration, each said memory layer structure comprising;
   a first ferromagnetic layer having a first uniaxial magnetic anisotropy comprised of a first induced uniaxial anisotropy or a first shape magnetic anisotropy, wherein said first shape magnetic anisotropy has a first shape magnetic anisotropy easy axis and a first shape magnetic anisotropy hard axis and said first induced uniaxial magnetic anisotropy has a first induced uniaxial magnetic anisotropy easy axis and a first induced uniaxial magnetic anisotropy hard axis;
   a second ferromagnetic layer having a second uniaxial magnetic anisotropy comprised of a second induced uniaxial anisotropy or a second shape magnetic anisotropy, wherein said second shape magnetic anisotropy has a second shape magnetic anisotropy easy axis and a second shape magnetic anisotropy hard axis and said second induced uniaxial magnetic anisotropy has a second induced uniaxial magnetic anisotropy easy axis and a second induced uniaxial magnetic anisotropy hard axis and said second induced uniaxial magnetic anisotropy easy axis is set substantially parallel to said first induced uniaxial magnetic anisotropy easy axis making a common induced uniaxial anisotropy easy axis;

an intermediate layer substantially between said first and said second ferromagnetic layers;

magnetostatic coupling having a magnetostatic coupling strength between said first ferromagnetic layer and said second ferromagnetic layer, wherein said magnetostatic coupling causes the anti-parallel magnetization confignration of said memory layer structure to be stable without the application of an external magnetic field such that said magnetic memory device has a stable magnetization direction and said stable magnetization direction is parallel to said common induced uniaxial anisotropy easy axis;

a first current path positioned such that a first magnetic field generated by passage of current through the first current path lies in a direction of about +(−) 45° from the common induced uniaxial magnetic anisotropy easy axis; and a second current path positioned such that a second magnetic field generated by passage of current through the second current path lies in a direction of about −(+) 45° from the common induced uniaxial magnetic anisotropy easy axis;

wherein each said memory layer structure is configured such that the magnetic memory device has a normalized total anisotropy field ($h_{k,total}$) and coupling field ($h_{couple}$) such that there is a relationship: $a(h_{couple}-1)+b(h_{couple}^2-1)^2 \leq h_{k,total} \leq 0.05(h_{couple}-1)$, with $25 > h_{couple} > 1$;

wherein said magnetic memory device operates in a toggle writing mode by applying a current to the first current path and second current path, such that the first magnetic field and the second magnetic field are generated temporally successive to each other, but overlapping so that the second magnetic field is present before the first magnetic field has dissipated, wherein for the relationship: $a(h_{couple}-1)+b(h_{couple}^2-1)^2 \leq h_{k,total} \leq 0.05(h_{couple}-1)$, a can be between and including −0.81 to −0.26 and b can be between and including −0.002 and −0.004.

2. The magnetic memory device of claim 1, wherein for the relationship $a(h_{couple}-1)+b(h_{couple}^2-1)^2 \leq h_{k,total} \leq 0.05(h_{couple}-1)$, a and b are −0.81 and −0.002, respectively.

3. The magnetic memory device of claim 1, wherein for the relationship $a(h_{couple}-1)+b(h_{couple}^2-1)^2 \leq h_{k,total} \leq 0.05(h_{couple}-1)$, a and b are −0.54 and −0.004, respectively.

4. The magnetic memory device of claim 1, wherein for the relationship $a(h_{couple}-1)+b(h_{couple}^2-1)^2 \leq h_{k,total} \leq 0.05(h_{couple}-1)$, a and b are −0.26 and −0.004, respectively.

5. The magnetic memory device of claim 1, wherein the first shape magnetic anisotropy easy axis and the second shape magnetic anisotropy easy axis are aligned parallel to the first induced uniaxial magnetic anisotropy easy axis and the second induced uniaxial magnetic anisotropy easy axis, respectively.

6. The magnetic memory device of claim 1, wherein the first shape magnetic anisotropy easy axis and the second shape magnetic anisotropy easy axis are aligned perpendicular to the first induced uniaxial magnetic anisotropy easy axis and the second induced uniaxial magnetic anisotropy easy axis, respectively.

7. The magnetic memory device of claim 6, wherein a first ratio of an absolute value of the first shape magnetic anisotropy to the first induced uniaxial magnetic anisotropy can be between approximately 0.8 and approximately 1.2 and a second ratio of an absolute value of the second shape magnetic anisotropy to the second induced uniaxial magnetic anisotropy can be between approximately 0.8 and approximately 1.2.

8. The magnetic memory device of claim 7, wherein a first ratio of an absolute value of the first shape magnetic anisotropy to the first induced uniaxial magnetic anisotropy can be between approximately 0.9 and approximately 1.1 and a second ratio of an absolute value of the second shape magnetic anisotropy to the second induced uniaxial magnetic anisotropy can be between approximately 0.9 and approximately 1.1.

9. The magnetic memory device of claim 1, wherein each said memory layer structure has a total magnetic anisotropy defined as a summation of the first shape magnetic anisotropy, the first induced uniaxial magnetic anisotropy, the second shape magnetic anisotropy and the second induced uniaxial magnetic anisotropy, and said total magnetic anisotropy is approximately equal to zero.

10. The magnetic memory device of claim 1, wherein the first ferromagnetic layer's first induced uniaxial magnetic anisotropy is approximately $1 \times 10^5$ erg/cc or greater and the second ferromagnetic layer's second induced uniaxial magnetic anisotropy is approximately $1 \times 10^5$ erg/cc or greater.

11. The magnetic memory device of claim 1, wherein the first ferromagnetic layer and the second ferromagnetic are comprised of a magnetic material selected from the group consisting of Co, Fe, Ni and their alloys.

12. The magnetic memory device of claim 1, wherein the first ferromagnetic layer and the second ferromagnetic are comprised of a magnetic material selected from the group consisting of Co, Fe, Ni and their alloys deposited on top of a single or multiple seed layers of materials selected from the group consisting of Cr, Cu, Ta and Ti.

13. The magnetic memory device of claim 11, wherein the first ferromagnetic layer and the second ferromagnetic layer are deposited by means of oblique or glancing angle deposition.

14. The magnetic memory device of claim 1, wherein the first ferromagnetic layer and the second ferromagnetic are grown on top of a template formed by utilizing a copolymer coating.

15. The magnetic memory device of claim 14, wherein the first ferromagnetic layer and the second ferromagnetic layer are comprised of body centered cubic materials, and is textured in the direction.

16. The magnetic memory device of claim 15, wherein the first ferromagnetic layer and the second ferromagnetic layer are comprised of one or more of Fe or FeCo alloys.

17. The magnetic memory device of claim 1, wherein the intermediate layer substantially between said first and said second ferromagnetic layers is chosen from the group consisting of Ru, Rh, Ir, Fe, Ni, Co, Cu, Al, Ag, Pt, Mn, Ta, and Ti and their alloys.

18. The magnetic memory device of claim 1, wherein the memory layer structure further comprises magnetic exchange coupling having a magnetic exchange coupling strength between the first ferromagnetic layer and the second ferromagnetic layer and said magnetostatic coupling strength is greater than the exchange coupling strength.

19. The magnetic memory device of claim 1, wherein the memory layer structure further comprises anti-parallel magnetic coupling having an anti-parallel magnetic coupling strength and said anti-parallel magnetic coupling strength is equal to or less than 0.1 erg/cm².

20. The magnetic memory device of claim 1, wherein said memory element further comprises an optimized normalized operating field ($h_{w,0}$) and said $h_{w,0}$ is controlled based at least in part by a relative bias field margin ($R_b$) applied to said memory element such that $h_{w,0}$ and $h_{couple}$ have the relationship expressed by $$h_{w,0} = \frac{h_{couple} - 1}{\alpha} + 0.5,$$

where $\alpha$ is defined as 2.28.

21. The magnetic memory device of claim 20, wherein said memory element further comprises an optimized normalized operating field ($h_{w,0}$) and said $h_{w,0}$ is controlled based at least in part based on the relationship $h_{w,0} \approx 0.37 + 043 h_{couple}$.

22. The magnetic memory device of claim 20, wherein said first memory layer structure has a total magnetic anisotropy defined as a summation of the first shape magnetic anisotropy and the first induced uniaxial magnetic anisotropy, and said second memory layer structure has the second shape magnetic anisotropy and the second induced uniaxial magnetic anisotropy, and said total magnetic anisotropy is approximately less than zero, word and digit fields can be an applied at angle less than 45° with respect to the first and second shape magnetic anisotropy easy axes and first and second shape magnetic anisotropy easy axes of the memory layer structures.

23. The magnetic memory device of claim 1, wherein $10 > h_{couple} > 1$.

* * * * *